(12) United States Patent
Ishizu et al.

(10) Patent No.: US 10,559,341 B2
(45) Date of Patent: Feb. 11, 2020

(54) METHOD FOR OPERATING THE SEMICONDUCTOR DEVICE

(71) Applicant: Semiconductor Energy Laboratory Co., Ltd., Kanagawa-ken (JP)

(72) Inventors: Takahiko Ishizu, Kanagawa (JP); Hikaru Tamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 360 days.

(21) Appl. No.: 15/414,085

(22) Filed: Jan. 24, 2017

(65) Prior Publication Data
US 2017/0221547 A1    Aug. 3, 2017

(30) Foreign Application Priority Data
Jan. 28, 2016   (JP) ................. 2016-014377

(51) Int. Cl.
*G11C 11/24*      (2006.01)
*G11C 11/406*     (2006.01)
*G06F 3/06*       (2006.01)
*G11C 11/4096*    (2006.01)

(52) U.S. Cl.
CPC ...... *G11C 11/40615* (2013.01); *G06F 3/0619* (2013.01); *G06F 3/0659* (2013.01); *G06F 3/0673* (2013.01); *G11C 11/4096* (2013.01)

(58) Field of Classification Search
CPC ............. G11C 11/40615; G06F 3/0619; G06F 3/0659; G06F 11/4096
See application file for complete search history.

(56) References Cited

U.S. PATENT DOCUMENTS

| 6,167,544 | A  | * | 12/2000 | Brady ............... G11C 29/50 365/201 |
| 6,169,691 | B1 | * | 1/2001  | Pasotti ............. G11C 11/5621 365/185.2 |
| 8,406,038 | B2 |   | 3/2013  | Saito et al. |
| 8,482,974 | B2 |   | 7/2013  | Saito et al. |
| 9,001,563 | B2 |   | 4/2015  | Atsumi et al. |
| 9,129,703 | B2 |   | 9/2015  | Saito |
| 9,336,853 | B2 |   | 5/2016  | Matsuzaki |
| 9,343,480 | B2 |   | 5/2016  | Yoneda |
| 2009/0190409 | A1 | * | 7/2009 | Dittrich ............. G11C 7/24 365/185.25 |
| 2011/0090207 | A1 | * | 4/2011 | Yamazaki ......... H01L 27/1225 345/211 |

(Continued)

FOREIGN PATENT DOCUMENTS

JP       2011-187950       9/2011

*Primary Examiner* — Ryan Bertram
*Assistant Examiner* — Trang K Ta
(74) *Attorney, Agent, or Firm* — Husch Blackwell LLP

(57) ABSTRACT

A method for performing a refresh operation on a memory cell efficiently is provided. A semiconductor device including a normal memory cell and a trigger memory cell that determines whether the refresh operation is performed or not is used. Specific data is written to the trigger memory cell, and the data is read from the trigger memory cell at predetermined timing. When the read data agrees with the written specific data, no special operation is performed. When the read data does not agree with the written specific data, a refresh operation is performed automatically.

12 Claims, 27 Drawing Sheets

(56) References Cited

U.S. PATENT DOCUMENTS

2012/0275214 A1* 11/2012 Atsumi ............... G11C 11/404
                                                  365/149
2015/0262642 A1    9/2015  Koyama
2015/0340076 A1   11/2015  Yakubo et al.
2015/0348610 A1   12/2015  Ishizu

* cited by examiner

FIG. 3

| Others | 0xE000_0000 |
| External devices | 0xA000_0000 |
| Peripheral | 0x4000_0000 |
| Internal RAM | 0x2000_0000 |
| Code | 0x0000_0000 |

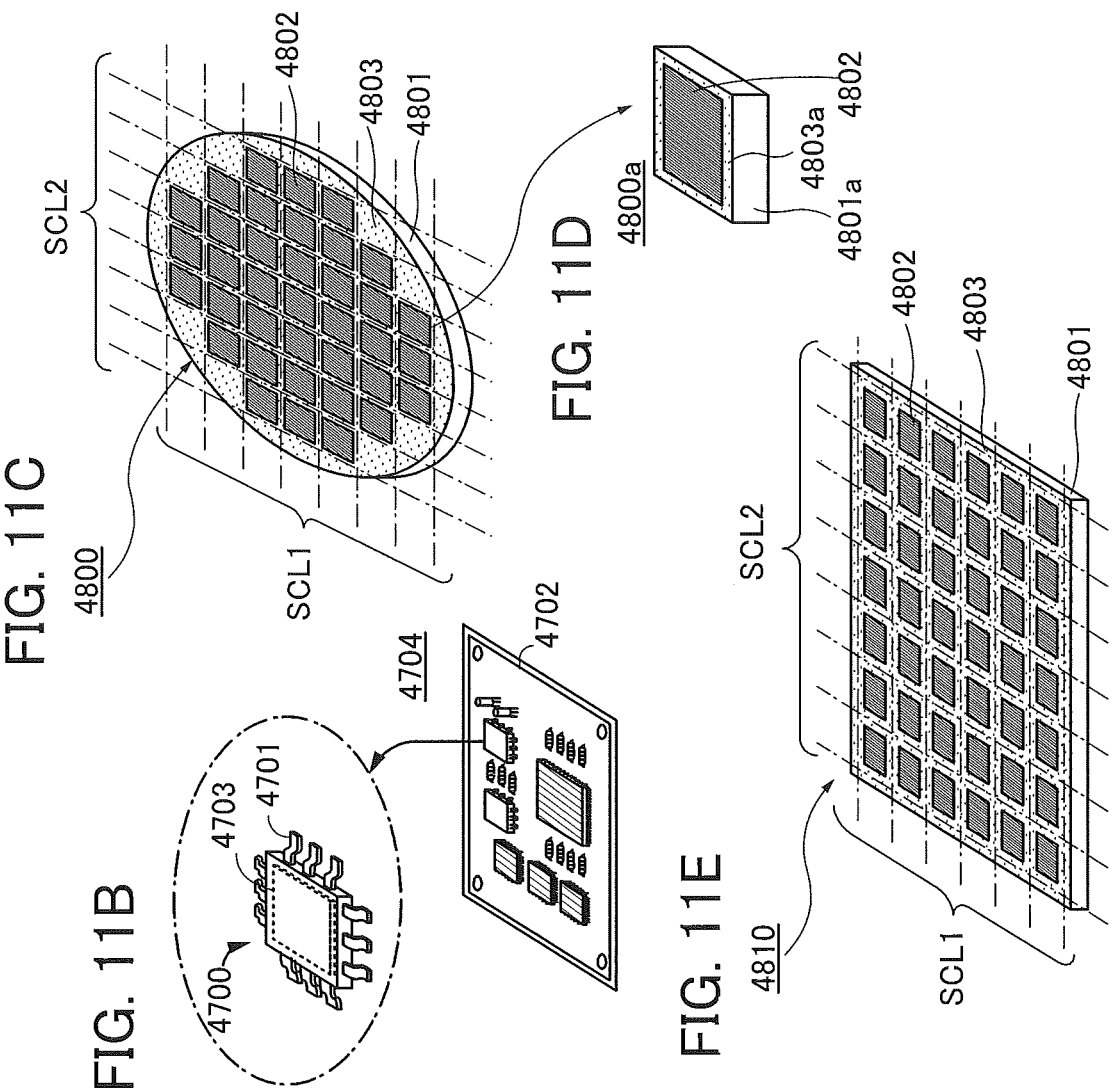

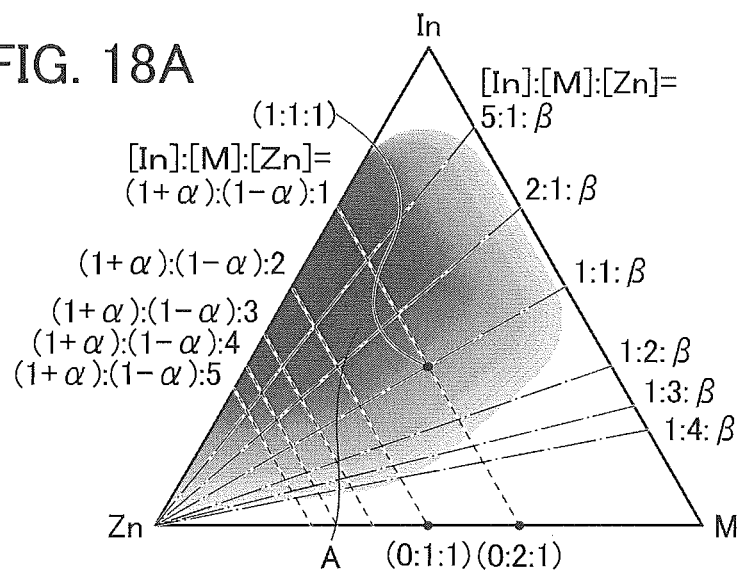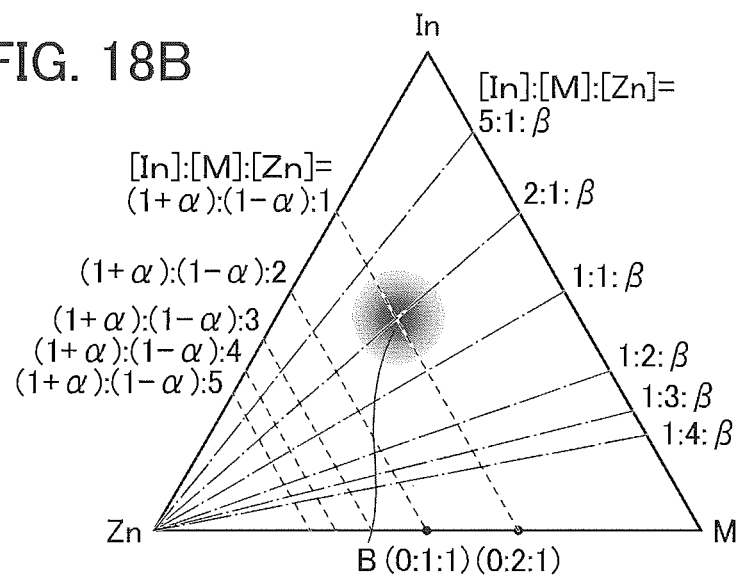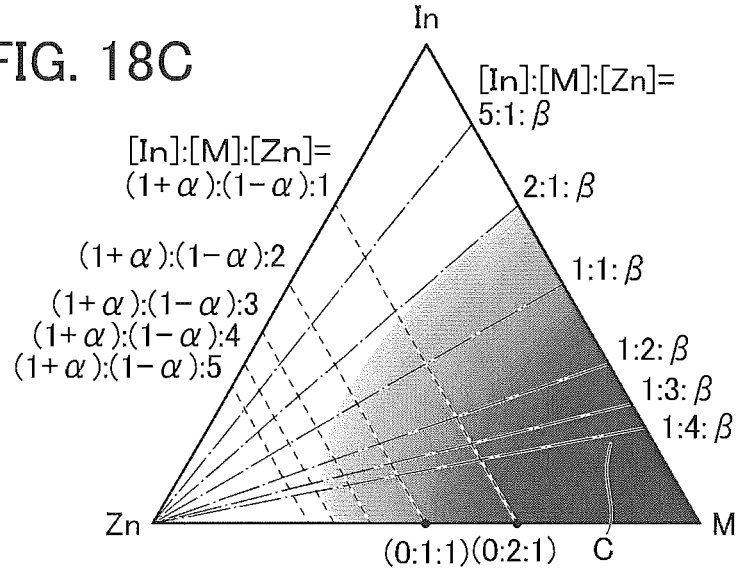

METHOD FOR OPERATING THE SEMICONDUCTOR DEVICE

BACKGROUND OF THE INVENTION

1. Field of the Invention

One embodiment of the present invention relates to a method for operating a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, semiconductor devices such as central processing units (CPUs), memories, or display devices have been used in various electronic devices such as mobile phones, personal computers, vehicle-mounted devices, and digital cameras.

It has been especially proposed to use a transistor whose channel formation region is formed using an oxide semiconductor (hereinafter also referred to as an "oxide semiconductor transistor" or an "OS transistor") for circuits included in the semiconductor devices. For example, Patent Document 1 discloses a memory cell that includes an OS transistor as a write transistor and thus can hold data even in the situation in which electric power is not supplied. This means that a memory including an OS transistor can be used as a nonvolatile memory.

REFERENCE

Patent Document

[Patent Document 1] Japanese Published Patent Application No. 2011-187950
[Patent Document 2] United States Patent Application Publication No. 2015/0348610

SUMMARY OF THE INVENTION

Many circuits such as a dynamic random access memory (DRAM) and a gain cell that includes two transistors and one capacitor have simple configurations. Thus, the performance of a memory module depends on the characteristics of a transistor used therein. For example, an on-state current of an OS transistor is lower than that of a transistor containing silicon in a channel formation region (hereinafter referred to as a Si transistor); thus, the operating speed of a memory module including the OS transistor is lower than that of a memory module including the Si transistor in some cases.

To improve the performance (e.g., operating speed) of the memory module including the OS transistor, it is needed to propose a novel operating method of the memory module.

The OS transistor has an extremely low off-state current, and thus the leakage current can be extremely low. That is, when the OS transistor is used as a write transistor, a read transistor, or the like of a memory cell included in the memory device, data can be held for a long period because the OS transistor has a low leakage current. Thus, the number of times of refresh operations for holding data can be reduced, which leads to lower power consumption of the memory device.

Data holding time greatly varies depending on the usage environment of the memory device in some cases. An example of a method for operating a memory device efficiently includes a method in which a refresh operation is not performed regularly, but the level of a potential held in a memory cell is checked and a refresh operation is performed when the level of the held potential reaches a certain value. Patent Document 2 discloses a circuit in which the potential of a replica memory cell is compared with a reference potential by a comparator and whether a refresh operation is performed or not is determined. In this case, another circuit needs to be provided for the determination; thus, the area of circuits in a memory device might be increased. In addition, the power consumption might be increased to drive the circuit for the determination.

An object of one embodiment of the present invention is to provide a novel semiconductor device. Another object of one embodiment of the present invention is to provide a memory device or a module including the novel semiconductor device. Another object of one embodiment of the present invention is to provide an electronic device including the memory device or the module including the novel semiconductor device. Another object of one embodiment of the present invention is to provide a system using the memory device or the module including the novel semiconductor device.

Another object of one embodiment of the present invention is to provide a memory device that performs a refresh operation efficiently. Another object of one embodiment of the present invention is to provide a memory device with a small circuit area. Another object of one embodiment of the present invention is to provide a memory device with low power consumption. Another object of one embodiment of the present invention is to provide an electronic device including the memory device.

Note that the objects of one embodiment of the present invention are not limited to the above objects. The objects described above do not disturb the existence of other objects. The other objects are the ones that are not described above and are described below. The other objects are apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a method for refreshing data in a semiconductor device that includes a CPU core, a first memory cell, and a second memory. The method includes a first step including a step of writing first data to the first memory cell; a second step including a step of executing a program in the CPU core; a third step including a step of interrupting the program in the CPU core; a fourth step including a step of reading second data from the first memory cell; a fifth step including a step of comparing the first data with the second data, a step of performing the second step in the case where the comparison shows that the first data agrees with the second data, and a step of performing a sixth step in the case where the comparison shows that the first data does not agree with the second data; and the sixth step including a step of performing a refresh operation on the first memory cell and the second memory cell, and a step of performing the second step.

(2) In the data refreshing method of one embodiment of the present invention according to (1), the first memory cell includes a first capacitor, the second memory cell includes a second capacitor, and the capacitance of the first capacitor is smaller than that of the second capacitor.

(3) In the data refreshing method of one embodiment of the present invention according to (1) or (2), the first memory cell includes a first transistor, the second memory cell includes a second transistor, the first transistor is used as a write transistor, the second transistor is used as a write transistor, a channel formation region of the first transistor includes an oxide semiconductor containing at least one of indium, an element M (the element M is aluminum, gallium, yttrium, or tin), and zinc, and a channel formation region of the second transistor includes an oxide semiconductor containing at least one of indium, the element M, and zinc.

(4) In the data refreshing method of one embodiment of the present invention according to (3), the first memory cell includes a third transistor, the second memory cell includes a fourth transistor, the third transistor is used as a read transistor, the fourth transistor is used as a read transistor, a channel formation region of the third transistor includes an oxide semiconductor containing at least one of indium, the element M, and zinc, and a channel formation region of the fourth transistor includes an oxide semiconductor containing at least one of indium, the element M, and zinc.

(5) Another embodiment of the present invention is a semiconductor wafer including the semiconductor device that uses the method for refreshing data according to any one of (1) to (4), and a region for dicing.

(6) Another embodiment of the present invention is an electronic device including the semiconductor device that uses the method for refreshing data according to any one of claims (1) to (4) and a housing.

One embodiment of the present invention can provide a novel semiconductor device. Another embodiment of the present invention can provide a memory device or a module including the novel semiconductor device. Another embodiment of the present invention can provide an electronic device including the memory device or the module including the novel semiconductor device. Another embodiment of the present invention can provide a system using the memory device or the module including the novel semiconductor device.

Another embodiment of the present invention can provide a memory device that performs a refresh operation efficiently. Another embodiment of the present invention can provide a memory device with a small circuit area. Another embodiment of the present invention can provide a memory device with low power consumption. Another embodiment of the present invention can provide an electronic device including the memory device.

Note that the effects of one embodiment of the present invention are not limited to the above effects. The effects described above do not disturb the existence of other effects. The other effects are the ones that are not described above and are described below. The other effects are apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIG. 3 illustrates an example of a memory map of an MCU.

FIG. 11A is a flow chart illustrating a manufacturing method of an electronic component, and FIGS. 11B to 11E are perspective views illustrating the electronic component.

FIGS. 18A to 18C each illustrate an atomic ratio range of an oxide.

DETAILED DESCRIPTION OF THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electronic appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like that includes a semiconductor element and is included in an electronic component or a module.

(Embodiment 1)

One embodiment of the present invention is an operating method that performs a refresh operation of a memory device efficiently. To perform the refresh operation efficiently, a memory device that includes a normal memory cell and a memory cell in which the capacitance for holding an electric charge is small (hereinafter referred to as a trigger memory cell in some cases) is used. The capacitance for holding an electric charge of the trigger memory cell is made smaller than that of the normal memory cell in order that the data holding time of the trigger memory cell is made shorter than that of the normal memory cell. Specific data is written to the trigger memory cell, and the data is read from the trigger memory cell at predetermined timing. When the read data agrees with the written specific data, no special operation is performed. Meanwhile, when the read data does not agree with the written specific data, a refresh operation is performed on both the normal memory cell and the trigger memory cell. That is, the trigger memory cell is used as a trigger for performing the refresh operation.

The refresh operation and the normal operation of the memory device are performed concurrently, so that the memory device can operate efficiently. Details of a semiconductor device including the memory device and the operating method of the semiconductor device are described below.

<MCU>

First, a memory control unit (MCU) is described. The operating method of a semiconductor device of one embodiment of the present invention can be implemented by incorporating a predetermined program in the MCU.

Figure 2:
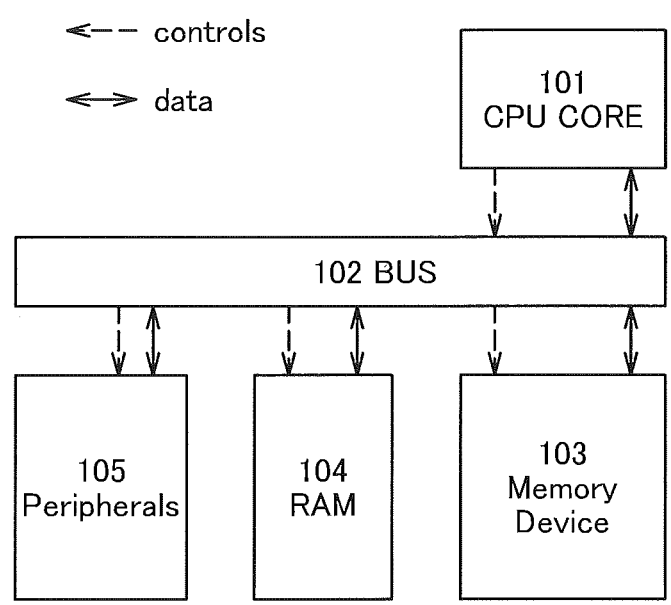
FIG. 2 is a block diagram illustrating an example of an MCU.

FIG. 2 is a block diagram for illustrating the operation of the MCU. The MCU is a device that controls and manages a memory and is included mainly in a CPU. Note that the MCU does not have to be included in a CPU but may be included in, for example, a memory device.

A CPU core 101 is electrically connected to a bus 102. A memory device 103, a RAM 104, and peripherals 105 are electrically connected to the bus 102. Note that in FIG. 2, data communication is denoted by solid-line arrows and instruction transmission is denoted by dashed-line arrows.

The CPU core 101 is an electronic circuit operating as a main processing device, and has a function of performing numerical calculation, data processing, device control, and the like according to a program. Note that in this embodiment, the MCU of the memory device 103 is included in the CPU core 101. In this specification, the CPU core 101 is assumed to be, for example, a 32-bit RISC processor.

The bus 102 has a function of switching data access destinations depending on an address output from the CPU core 101.

The memory device 103 is an electronic circuit that includes a memory cell array, a word line selection driver circuit, a bit line selection driver circuit, a sense amplifier, a precharge circuit, and the like. Note that depending on the configuration of a memory cell included in a memory cell array, not all the above-described circuits are needed or the above-described circuits are insufficient in some cases.

The RAM 104 is an electronic circuit that holds data temporarily. The RAM 104 mainly holds data in the memory device 103, internal address of the memory cell array of the memory device 103, and the like.

The peripherals 105 are circuits other than the CPU core 101, the memory device 103, and the RAM 104. An example of the peripherals 105 is an error check and correct (ECC) circuit that checks and corrects errors.

Next, a memory map of the MCU is illustrated in FIG. 3. A memory map is a map in which the vertical axis indicates an address and places or regions where programs or data are stored are collectively shown. When data is communicated, the MCU refers to the memory map to obtain an access destination. For example, when data is read from the memory device, the MCU obtains an address of the memory device holding the data from the memory map and accesses the place of the address. Note that the memory map in FIG. 3 shows "Code", "Internal RAM", "Peripheral", "External devices", and "Others" as an example.

The "Code" in FIG. 3 corresponds to an existing program. The address of the existing program is between 0x0000_0000 to 0x1FFF_FFFF.

The "Internal RAM" in FIG. 3 corresponds to the memory device 103 and the RAM 104. The addresses of the memory device 103 and the RAM 104 are between 0x2000_0000 to 0x3FFF_FFFF.

Note that the memory device 103 includes the normal memory cell and the trigger memory cell; the details are described later. In this specification, the address of the trigger memory cell is 0x2000_0000.

The "Peripheral" in FIG. 3 corresponds to the peripherals 105. The address of the peripherals 105 is between 0x4000_0000 to 0x9FFF_FFFF.

The "External devices" in FIG. 3 correspond to external circuits or external devices. The address of the external circuit or the external device is between 0xA000_0000 to 0xDFFF_FFFF.

The "Others" in FIG. 3 correspond to holding regions or the like other than the above-described components. The address of the holding region or the like other than the above-described components is between 0xE000_0000 to 0xFFFF_FFFF.

<Memory Device>

Here, the memory cells included in the memory device 103 are described. The memory device 103 includes a memory cell 200 and a memory cell 201 illustrated in FIGS. 4A and 4B.

The memory cell 200 is used as the normal memory cell. The memory cell 200 is a gain cell including two transistors and one capacitor and includes an n-channel transistor MO2, a p-channel transistor MS1, and a capacitor C2. Note that the transistor MO2 preferably has the structure of any transistor described in Embodiment 8.

A first terminal of the transistor MO2 is electrically connected to a first terminal of the capacitor C2. A gate of the transistor MS1 is electrically connected to the first terminal of the capacitor C2.

The memory cell 201 is used as the trigger memory cell that is employed to determine whether the refresh operation is performed or not. The memory cell 201 is also a gain cell including two transistors and one capacitor. The memory cell 201 includes an n-channel transistor MO2$t$, a p-channel transistor MS1$t$, and a capacitor C2$t$. Note that the transistor MO2$t$ preferably has the structure of any of the transistors described in Embodiment 8.

A first terminal of the transistor MO2t is electrically connected to a first terminal of the capacitor C2t. A gate of the transistor MS1t is electrically connected to the first terminal of the capacitor C2t.

The transistor MO2 and the transistor MO2t each function as a write transistor. The transistor MS1 and the transistor MS1t each function as a read transistor. The capacitor C2 has a function of holding the potential of the gate of the transistor MS1. The capacitor C2t has a function of holding the potential of the gate of the transistor MS1t.

The capacitance of the capacitor C2t is preferably smaller than that of the capacitor C2. For example, the capacitance of the capacitor C2t is 80% of the capacitance of the capacitor C2, preferably smaller than 80% of the capacitance of the capacitor C2.

The size and materials of the transistor MO2t may be the same as those of the transistor MO2. The size and materials of the transistor MS1t may be the same as those of the transistor MS1.

An oxide semiconductor containing at least one of indium, an element M (the element M is aluminum, gallium, yttrium, or tin), and zinc is preferably included in a channel formation region of the transistor MO2. In particular, an oxide semiconductor containing indium, gallium, and zinc is preferably included. A transistor including an oxide semiconductor containing indium, gallium, and zinc has an extremely low off-state current, and thus when the transistor is used as the transistor MO2, the leakage current of the transistor MO2 can be very low. That is, written data can be held in the transistor MO2 for a long time, and thus the frequency of the refresh operation for the memory cell can be decreased.

The material of a channel formation region of the transistor MO2t is preferably similar to that of the channel formation region of the transistor MO2.

The channel formation region of the transistor MS1 preferably includes silicon. Depending on circumstances or conditions or as needed, the material of the channel formation region of the transistor MS1 may be the same as that of the channel formation region of the transistor MO2.

The channel formation region of the transistor MS1t preferably includes silicon. Depending on circumstances or conditions or as needed, the material of the channel formation region of the transistor MS1t may be the same as that of the channel formation region of the transistor MO2t.

Figure 4A:
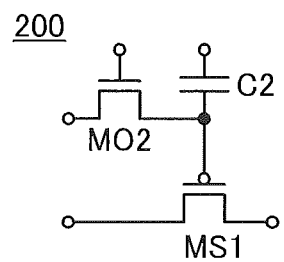
FIGS. 4A to 4F are circuit diagrams illustrating examples of a memory cell included in a semiconductor device.
Figure 4D:
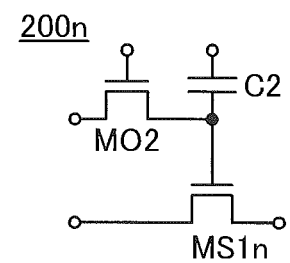
Figure 4B:
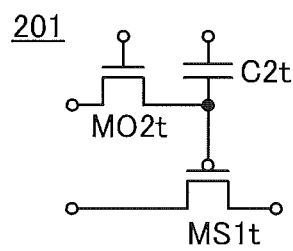
Figure 4E:
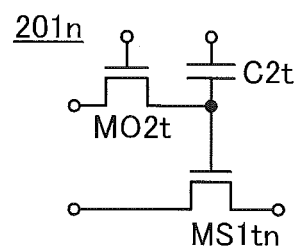
Figure 4C:
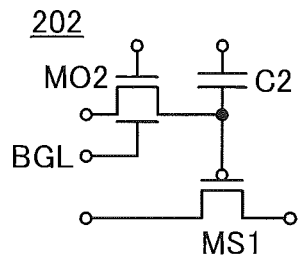
Figure 4F:
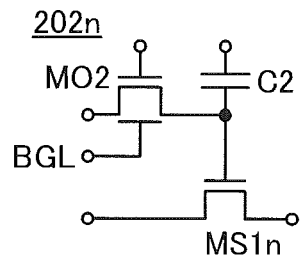

The transistor MS1 and the transistor MS1t are p-channel transistors in FIGS. 4A to 4C but may be n-channel transistors depending on circumstances or conditions or as needed. FIGS. 4D to 4F illustrate the configurations of memory cells in which the transistor MS1 and the transistor MS1t are n-channel transistors. A memory cell 200n in FIG. 4D is a memory cell in which the transistor MS1 in FIG. 4A is replaced with an n-channel transistor MS1n. A memory cell 201n in FIG. 4E is a memory cell in which the transistor MS1t in FIG. 4B is replaced with an n-channel transistor MS1tn. The material of the channel formation region of the transistor MS1n is preferably the same as that of the channel formation region of the transistor MO2. In addition, the material of the channel formation region of the transistor MS1tn is preferably the same as that of the channel formation region of the transistor MO2t. When the material of the channel formation region of the transistor MO2 is made the same as that of the channel formation region of the transistor MS1n, the manufacturing process of the semiconductor device of one embodiment of the present invention can be shortened. In addition, since the material of the channel formation region of the transistor MO2t is made the same as that of the channel formation region of the transistor MS1tn, the manufacturing process of the semiconductor device of one embodiment of the present invention can be shortened.

The memory device 103 may have a configuration in which the transistor MO2 of the memory cell 200 is provided with a back gate. A memory cell in which the transistor MO2 is provided with a back gate is illustrated in FIG. 4C. The transistor MO2 of a memory cell 202 has a dual-gate structure including a back gate in addition to a front gate (a front gate is simply referred to as a gate in this specification). The back gate of the transistor MO2 is electrically connected to a wiring BGL. The threshold voltage of the transistor MO2 can be increased or decreased by applying an arbitrary potential to the wiring BGL. The memory cell of one embodiment of the present invention may have a configuration of a memory cell 202n illustrated in FIG. 4F in which the transistor MS1 of the memory cell 202 in FIG. 4C is replaced with the n-channel transistor MS1n.

The memory device 103 includes the memory cell 200 and the memory cell 201. Here, the memory capacity of the memory device 103 is 8 KB. When the byte offset of the addresses of the memory device 103 is 2 bits, the memory device 103 has an address space from 0x000 to 0x7FF.

Figure 5:
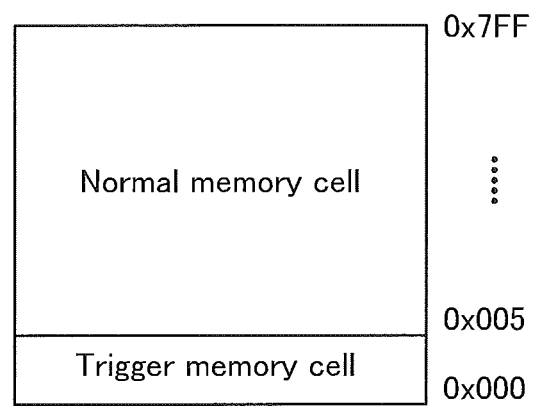
FIG. 5 illustrates an example of a memory map of a memory device.

FIG. 5 illustrates a memory map in which the memory capacity of the memory device 103 is 8 KB. In this embodiment, for example, the address of the trigger memory cell (the memory cell 201) is from 0x000 to 0x004, and the address of the normal memory cell (the memory cell 200) is the rest of the addresses that are from 0x005 to 0x7FF.

Next, configuration examples of a memory cell array and a driver circuit of the memory device 103 including the memory cell 200 and the memory cell 201 are described.

Figure 6:
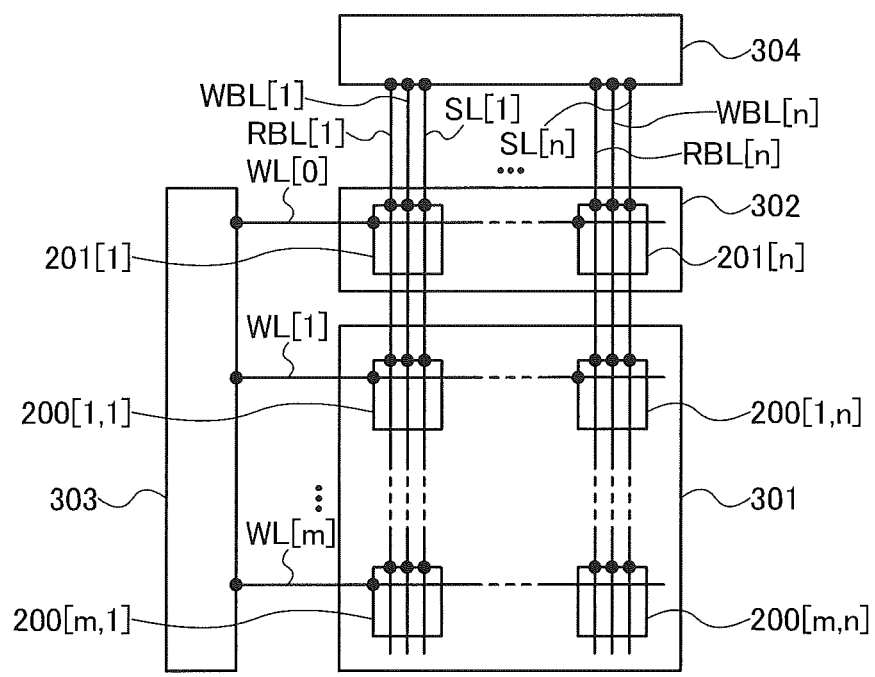
FIG. 6 is a block diagram illustrating a configuration example of a memory device.

FIG. 6 is a block diagram illustrating the configuration example of the memory cell array and the driver circuit of the memory device 103. The memory device 103 includes a memory cell array 301, a circuit portion 302, a word line driver circuit 303, and a bit line driver circuit 304. The memory cell array 301 includes in memory cells 200 in the column direction (in is an integer greater than or equal to 1) and n memory cells 200 in the row direction (n is an integer greater than or equal to 1), and thus the memory cells 200 are provided in an m×n matrix. Note that in FIG. 6, the memory cell 200 positioned in the first row and the first column is referred to as a memory cell 200[1,1], the memory cell 200 positioned in the m-th row and the first column is referred to as a memory cell 200[m,1], the memory cell 200 positioned in the first row and the n-th column is referred to as a memory cell 200[1,n], the memory cell 200 positioned in the m-th row and the n-th column is referred to as a memory cell 200[m,n], and other memory cells 200 are not illustrated. The circuit portion 302 includes n memory cells 201 in the row direction. Note that in FIG. 6, the memory cell 201 positioned in the first column is referred to as the memory cell 200[1], the memory cell 201 positioned in the n-th column is referred to as the memory cell 201[n], and other memory cells 201 are not illustrated.

The word line driver circuit 303 is electrically connected to the memory cell array 301 and the circuit portion 302 via wirings WL[0] to WL[m]. Specifically, the wiring WL[0] is electrically connected to the memory cells 201[1] to 201[n] included in the circuit portion 302, the wiring WL[1] is electrically connected to the memory cells 200[1,1] to 200[1,n] positioned in the first row of the memory cell array 301, and the wiring WL[m] is electrically connected to the memory cells 200[m,1] to 200[m,n] positioned in the m-th row of the memory cell array 301.

The bit line driver circuit 304 is electrically connected to the memory cell array 301 and the circuit portion 302 via wirings RBL[1] to RBL[n]. In addition, the bit line driver circuit 304 is electrically connected to the memory cell array 301 and the circuit portion 302 via wirings WBL[1] to WBL[n]. Moreover, the bit line driver circuit 304 is electrically connected to the memory cell array 301 and the circuit portion 302 via wirings SL[1] to SL[n]. Specifically, the wiring RBL[1], the wiring WBL[1], and the wiring SL[1] are electrically connected to the memory cell 201[1] and the memory cells 200[1,1] to 200[m,1] positioned in the first column of the memory cell array 301. The wiring RBL[n], the wiring WBL[n], and the wiring SL[n] are electrically connected to the memory cell 201[n] and the memory cells 200[1,n] to 200[m,n] positioned in the n-th column of the memory cell array 301.

Figure 7A:
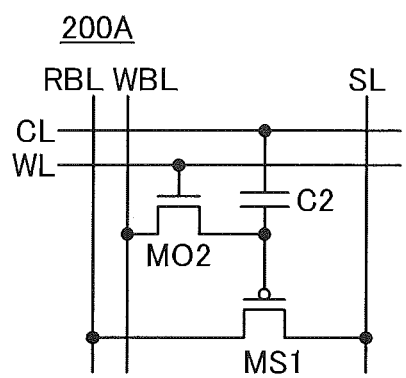
FIGS. 7A to 7C are circuit diagrams illustrating examples of a memory cell included in a memory device.

FIG. 7A illustrates a connection configuration of each of the memory cells 200[1,1] to 200[m,n] and wirings in this case. FIG. 7A illustrates a memory cell 200A in which the memory cell 200 in FIG. 4A is connected to wirings.

The second terminal of the transistor MO2 is electrically connected to the wiring WBL, and the gate of the transistor MO2 is electrically connected to the wiring WL. A second terminal of the capacitor C2 is electrically connected to a wiring CL. A first terminal of the transistor MS1 is electrically connected to the wiring RBL, and a second terminal of the transistor MS1 is electrically connected to the wiring SL.

The wiring WBL is any of the wirings WBL[1] to WBL[n] illustrated in FIG. 6 and functions as a write bit line. The wiring RBL is any of the wirings RBL[1] to RBL[n] illustrated in FIG. 6 and functions as a read bit line. The wiring SL is any of the wirings SL[1] to SL[n] illustrated in FIG. 6 and has a function of supplying a predetermined potential to the second terminal of the transistor MS1. Note that the wirings WBL, RBL, and SL are connected to the memory cells 200 in one column; for example, when the wiring WBL is electrically connected to the memory cells 200[1,j] to 200[m,j] (j is an integer greater than or equal to 1 and less than or equal to n), the wiring WBL can be referred to as the wiring WBL[j], and the wiring RBL and the wiring SL can also be uniquely referred to as the wiring RBL[j] and the wiring SL[j], respectively.

The wiring WL is any of the wirings WL[1] to WL[m] illustrated in FIG. 6 and functions as a word line. The wiring CL is not illustrated in FIG. 6 and has a function of supplying a predetermined potential to the second terminal of the capacitor C2.

The memory cells 201[1] to 201[n] each have a connection configuration similar to that of the above-described memory cell 200A.

In this configuration example, a plurality of memory cells 201 are illustrated in FIG. 6; however, one embodiment of the present invention is not limited thereto and one memory cell 201 may be provided.

Figure 7B:
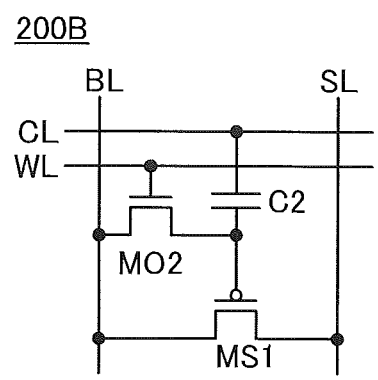
Figure 7C:
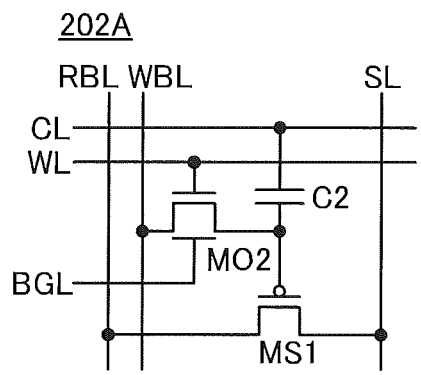

The configuration examples of the memory cell array and the driver circuit of the memory device 103 of one embodiment of the present invention are not limited to the circuit configuration of FIG. 6. Depending on circumstances or conditions or as needed, whether wirings, circuits, elements, or the like are provided or not can be determined and their connection configuration can be changed. For example, the wiring WBL and the wiring RBL may be integrated into one common wiring. A memory cell 200B illustrated in FIG. 7B has a connection configuration in which the wiring WBL and the wiring RBL are integrated into one wiring BL. Alternatively, for example, as in the memory cell 202 illustrated in FIG. 4C, the transistor MO2 may have a back gate. A memory cell 202A illustrated in FIG. 7C has the connection configuration of the memory cell 200A and includes the transistor MO2 having a back gate. The back gate of the transistor MO2 is electrically connected to the wiring BGL. The threshold voltage of the transistor MO2 can be increased or decreased by supplying an arbitrary potential to the wiring BGL.

<Operating Example>

Next, an example of the operating method of the semiconductor device of one embodiment of the present invention is described.

Figure 1:
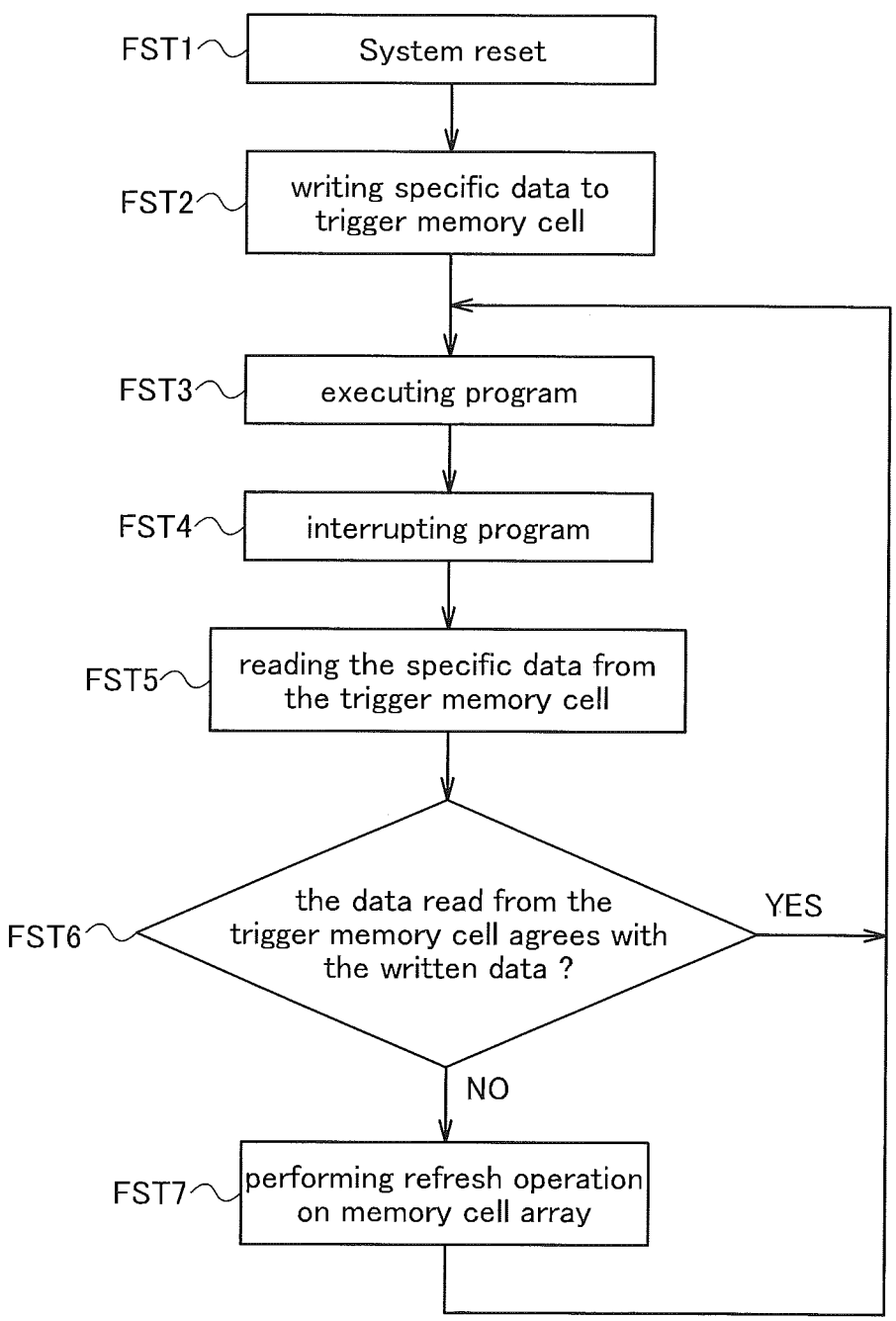
FIG. 1 is a timing chart illustrating an example of a system.

FIG. 1 is a flow chart showing the operating example of the semiconductor device of one embodiment of the present invention. The flow chart in FIG. 1 includes Steps FST1 to FST7, and in accordance with this flow chart, the refresh operation of the memory device 103 is performed.

In Step FST1, a system is initialized. Note that the system refers to a semiconductor device including a memory device and an MCU in which an operating method of one embodiment of the present invention is incorporated as a program. The initialization of the system means that deletion of a temporary file, reading of a configuration file, or the like is performed to initiate the operating method of one embodiment of the present invention.

After Step FST1, Step FST2 is performed. In Step FST2, specific data is written to the trigger memory cell. Specifically, an MCU refers to the memory map to obtain an address of the region where data to be written to the trigger memory cell is held (here, 0xFFFF_FFFF), and makes the CPU core 101 access the region where the data is held, and the data is read. Next, the MCU refers to the memory map to obtain an address of the trigger memory cell (0x2000_0000), and makes the CPU core 101 access the trigger memory cell of the memory device 103, and the data is written to the trigger memory cell.

In Step FST3, an executing program for controlling and managing the semiconductor device, which is normally performed by the CPU core 101, is executed.

In Step FST4, the program is interrupted. Note that the timing when Step FST4 is performed can be freely determined by a designer, a user, or the like (e.g., timing at which a program can be interrupted or after a lapse at a predetermined time).

After the interruption of the program, Step FST5 is performed. In Step FST5, the MCU refers to the memory map to obtain an address of the trigger memory cell (0x2000_0000), and makes the CPU core 101 access the trigger memory cell of the memory device 103, and the data is read from the trigger memory cell. The data read at this step is transmitted to the CPU core 101.

After the data read from the trigger memory cell is transmitted to the CPU core 101, Step FST6 is performed. In Step FST6, it is checked whether the data read from the trigger memory cell agrees with the written data (data that is held in the region of the address of 0xFFFF_FFFF and read in Step FST2). Specifically, the MCU refers to the memory map to obtain the address of 0xFFFF_FFFF, and makes the CPU core 101 access the region of the address, and the data held in the address is read. After that, in the CPU core 101, the MCU compares the data read from the trigger memory cell and the data in the region of the address of 0xFFFF_FFFF.

That is, in Step FST6, it is determined whether the data held in the trigger memory cell deteriorates. In the case where the data read from the trigger memory cell does not agree with the data in the region of the address of 0xFFFF_FFFF, Step FST7 is performed. In the case where the data read from the trigger memory cell agrees with the data in the region of the address of 0xFFFF_FFFF, Step FST3 is performed, and the program interrupted in Step FST4 is resumed.

Since the determination result of Step FST5 shows that the data held in the trigger memory cell deteriorates, the refresh operation is performed on the memory cell array of the memory device 103 in Step FST7. Accordingly, the data held in the normal memory cell and the trigger memory cell of the memory device 103 are refreshed, so that the data that has deteriorated can be recovered. After Step FST7, Step FST3 is performed, and the program interrupted in Step FST4 is resumed.

By incorporating the above-described operating method in the MCU, a semiconductor device that is suitable for the usage environment and performs the refresh operation efficiently can be fabricated. The power consumption of the semiconductor device of one embodiment of the present invention can be lower than that of a conventional semiconductor device. Furthermore, the semiconductor device of one embodiment of the present invention has a smaller circuit area than the conventional semiconductor device and thus can be included in a small electronic device and the like.

In this embodiment, one embodiment of the present invention has been described. Other embodiments of the present invention are described in other embodiments. Note that one embodiment of the present invention is not limited to the above examples. In other words, various embodiments of the invention are described in this embodiment and the other embodiments, and one embodiment of the present invention is not limited to a particular embodiment. Depending on the circumstances or conditions, transistors of one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors of one embodiment of the present invention, the channel formation regions of the transistors, the source and drain regions of the transistors, and the like do not necessarily include an oxide semiconductor.

Note that this embodiment can be combined with any of the other embodiments in this specification as appropriate.

(Embodiment 2)

The memory device that includes the gain cell including two transistors and one capacitor is described in Embodiment 1; however, one embodiment of the present invention is not limited thereto. This embodiment explains a memory cell that can be used in the memory device 103 and is different from the gain cell including two transistors and one capacitor.

<DRAM>

Figure 8A:
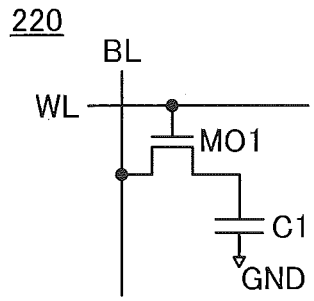
FIGS. 8A to 8F are circuit diagrams illustrating an example of a memory cell included in a memory device.

FIG. 8A illustrates a circuit configuration of a memory cell of a DRAM. A memory cell 220 includes a transistor MO1 and a capacitor C1. Note that the transistor MO1 preferably has the structure of any of the transistors described in Embodiment 8.

A first terminal of the transistor MO1 is electrically connected to a first terminal of the capacitor C1. A second terminal of the transistor MO1 is electrically connected to the wiring BL. A gate of the transistor MO1 is electrically connected to the wiring WL. A second terminal of the capacitor C1 is electrically connected to a wiring GND.

The wiring BL functions as a bit line, and the wiring WL functions as a word line. The wiring GND functions as a wiring for applying a predetermined potential to the second terminal of the capacitor C1. When data is written or read, a low-level potential (also referred to as a reference potential in some cases) is preferably applied to the wiring GND.

In the case where the memory cell 220 is used as the normal memory cell, an oxide semiconductor containing at least one of indium, the element M described in Embodiment 1, and zinc is preferably included in a channel formation region of the transistor MO1. In particular, an oxide semiconductor containing indium, gallium, and zinc is preferably included. A transistor including an oxide semiconductor containing indium, gallium, and zinc has an extremely low off-state current, and thus when the transistor is used as the transistor MO1, the leakage current of the transistor MO1 can be very low. That is, written data can be held in the transistor MO1 for a long time, and thus the frequency of the refresh operation for the memory cell can be decreased.

In the case where the memory cell 220 is used as the trigger memory cell, the material of the channel formation region of the transistor MO1 in the trigger memory cell is preferably similar to the material of the channel formation region of the channel formation MO1 in the normal memory cell.

The capacitance of the capacitor C1 in the trigger memory cell is preferably smaller than that of the capacitor C1 in the normal memory cell. When the capacitance of the capacitor C1 in the trigger memory cell is smaller than that of the capacitor C1 in the normal memory cell, the data holding time of the trigger memory cell can be shortened.

Figure 8B:
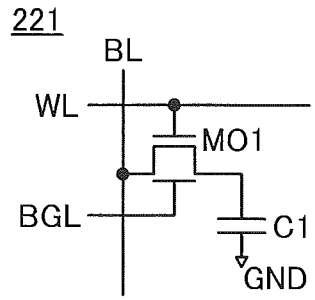

The memory device 103 may have a configuration in which the transistor MO1 of the memory cell 220 is provided with a back gate. A memory cell in which the transistor MO1 is provided with a back gate is illustrated in FIG. 8B. The transistor MO1 of a memory cell 221 has a dual-gate structure including a back gate in addition to a front gate (a front gate is simply referred to as a gate in this specification). The back gate of the transistor MO1 is electrically connected to the wiring BGL. The threshold voltage of the transistor MO1 can be increased or decreased by applying an arbitrary potential to the wiring BGL.

<Gain Cell Including Three Transistors>

Figure 8C:
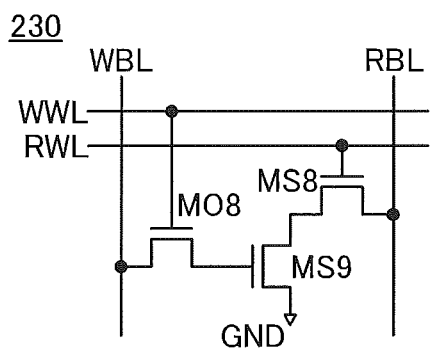

FIG. 8C illustrates a circuit configuration of a gain cell including three transistors. A memory cell 230 includes a transistor MO8, a transistor MS8, and a transistor MS9. Note that the transistor MO8 preferably has the structure of any of the transistors described in Embodiment 8.

A first terminal of the transistor MO8 is electrically connected to a gate of the transistor MS9. A second terminal of the transistor MO8 is electrically connected to the wiring WBL. A gate of the transistor MO8 is electrically connected to a wiring WWL. A first terminal of the transistor MS8 is electrically connected to the wiring RBL. A second terminal of the transistor MS8 is electrically connected to a first terminal of the transistor MS9. A gate of the transistor MS8 is electrically connected to a wiring RWL. A second terminal of the transistor MS9 is electrically connected to the wiring GND.

The wiring WBL functions as a write bit line. The wiring RBL functions as a read bit line. The wiring WWL functions as a write word line. The wiring RWL functions as a read word line.

The wiring GND is a wiring for supplying the low-level potential.

Data is written by applying a high-level potential to the wiring WWL to turn on the transistor MO8 so that the wiring WBL is electrically connected to the gate of the transistor MS9. Specifically, when the transistor MO8 is on, a potential corresponding to data to be held is applied to the wiring WBL, and the potential is written to the gate of the transistor MS9. Then, the low-level potential is applied to the wiring WWL so that the transistor MO8 is turned off. Accordingly, the potential of the gate of the transistor MS9 is held.

Data is read by precharging the wiring RBL to a predetermined potential, and then making the wiring RBL in a floating state and applying the high-level potential to the wiring RWL. Since the wiring RWL is supplied with the high-level potential, the transistor MS8 is turned on, so that the wiring RBL is electrically connected to the first terminal of the transistor MS9. At this time, the potential of the wiring RBL is applied to the first terminal of the transistor MS9; however, the potential of the first terminal of the transistor MS9 and the potential of the wiring RBL are changed depending on the potential held in the gate of the transistor MS9. Here, the potential held in the gate of the transistor MS9 can be read by reading the potential of the wiring RBL. That is, the data written in this memory cell can be read from the potential held in the gate of the transistor MS9.

In the case where the memory cell 230 is used as the normal memory cell, an oxide semiconductor containing at least one of indium, the element M, and zinc is preferably included in a channel formation region of the transistor MO8. In particular, an oxide semiconductor containing indium, gallium, and zinc is preferably included. A transistor including an oxide semiconductor containing indium, gallium, and zinc has an extremely low off-state current, and thus when the transistor is used as the transistor MO8, the leakage current of the transistor MO8 can be very low. That is, written data can be held in the transistor MO8 for a long time, and thus the frequency of the refresh operation for the memory cell can be decreased.

In the case where the memory cell 230 is used as the trigger memory cell, the material of the channel formation region of the transistor MO8 in the trigger memory cell is preferably similar to the material of the channel formation region of the channel formation MO8 in the normal memory cell.

The channel formation region of the transistor MS8 or MS9 preferably includes silicon. Depending on circumstances or conditions or as needed, the material of the channel formation region of the transistor MS8 or MS9 may be the same as that of the channel formation region of the transistor MO8.

Figure 8D:
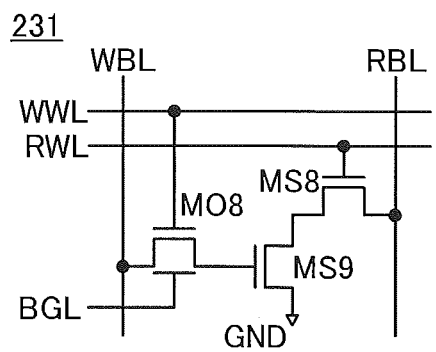

The memory device 103 may have a configuration in which the transistor MO8 of the memory cell 230 is provided with a back gate. A memory cell in which the transistor MO8 is provided with a back gate is illustrated in FIG. 8D. The transistor MO8 of a memory cell 231 has a dual-gate structure including a back gate in addition to a front gate (a front gate is simply referred to as a gate in this specification). The back gate of the transistor MO8 is electrically connected to the wiring BGL. The threshold voltage of the transistor MO8 can be increased or decreased by applying an arbitrary potential to the wiring BGL.

<Gain Cell Including Three Transistors and One Capacitor>

Figure 8E:
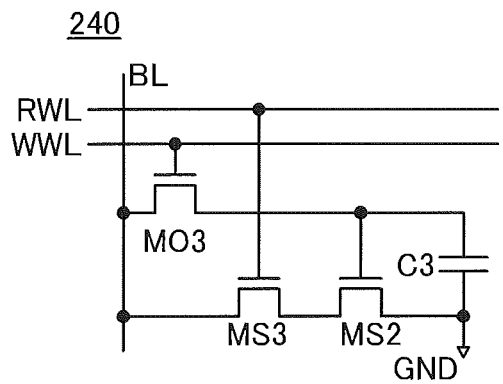

FIG. 8E illustrates a gain cell including three transistors and one capacitor. A memory cell 240 includes a transistor MO3, a transistor MS2, a transistor MS3, and a capacitor C3. Note that the transistor MO3 preferably has the structure of any of the transistors described in Embodiment 8.

A first terminal of the transistor MO3 is electrically connected to a first terminal of the capacitor C3. A second terminal of the transistor MO3 is electrically connected to the wiring BL. A gate of the transistor MO3 is electrically connected to the wiring WWL. A second terminal of the capacitor C3 is electrically connected to a first terminal of the transistor MS2 and a wiring GND. A second terminal of the transistor MS2 is electrically connected to a first terminal of the transistor MS3. A gate of the transistor MS2 is electrically connected to the first terminal of the capacitor C3. A second terminal of the transistor MS3 is electrically connected to the wiring BL, and a gate of the transistor MS3 is electrically connected to the wiring RWL.

The wiring BL functions as a bit line. The wiring WWL functions as a write word line. The wiring RWL functions as a read word line.

The wiring GND is a wiring for supplying the low-level potential.

Data is written by applying the high-level potential to the wiring WWL to turn on the transistor MO3 so that the wiring BL is electrically connected to the first terminal of the capacitor C3. Specifically, when the transistor MO3 is on, a potential corresponding to data to be held is applied to the wiring BL, and the potential is written to the first terminal of the capacitor C3 and the gate of the transistor MS2. Then, the low-level potential is applied to the wiring WWL so that the transistor MO3 is turned off. Accordingly, the potentials of the first terminal of the capacitor C3 and the gate of the transistor MS2 are held.

Data is read by precharging the wiring BL to a predetermined potential, and then making the wiring BL in a floating state and applying the high-level potential to the wiring RWL. Since the wiring RWL is supplied with the high-level potential, the transistor MS3 is turned on, so that the wiring BL is electrically connected to the second terminal of the transistor MS2. At this time, the potential of the wiring BL is applied to the second terminal of the transistor MS2; however, the potential of the second terminal of the transistor MS2 and the potential of the wiring BL are changed depending on the potential held in the first terminal of the capacitor C3 (or the gate of the transistor MS2). Here, the potential held in the first terminal of the capacitor C3 (or the gate of the transistor MS2) can be read by reading the potential of the wiring BL. That is, the data written in this memory cell can be read from the potential held in the first terminal of the capacitor C3 (or the gate of the transistor MS2).

In the case where the memory cell 240 is used as the normal memory cell, an oxide semiconductor containing at least one of indium, the element M, and zinc is preferably included in a channel formation region of the transistor MO3. In particular, an oxide semiconductor containing indium, gallium, and zinc is preferably included. A transistor including an oxide semiconductor containing indium, gallium, and zinc has an extremely low off-state current, and thus when the transistor is used as the transistor MO3, the leakage current of the transistor MO3 can be very low. That is, written data can be held in the transistor MO3 for a long time, and thus the frequency of the refresh operation for the memory cell can be decreased.

In the case where the memory cell 240 is used as the trigger memory cell, the material of the channel formation region of the transistor MO3 in the trigger memory cell is preferably similar to the material of the channel formation region of the channel formation MO3 in the normal memory cell.

The channel formation region of the transistor MS2 or MS3 preferably includes silicon. Depending on circumstances or conditions or as needed, the material of the channel formation region of the transistor MS2 or MS3 may be the same as that of the channel formation region of the transistor MO3.

Figure 8F:
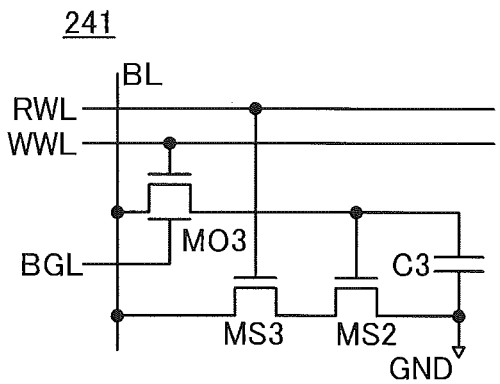

The memory device 103 may have a configuration in which the transistor MO3 of the memory cell 240 is provided with a back gate. A memory cell in which the transistor MO3 is provided with a back gate is illustrated in FIG. 8F. The transistor MO3 of a memory cell 241 has a dual-gate structure including a back gate in addition to a front gate (a front gate is simply referred to as a gate in this specification). The back gate of the transistor MO3 is electrically connected to the wiring BGL. The threshold voltage of the transistor MO3 can be increased or decreased by applying an arbitrary potential to the wiring BGL.

Note that this embodiment can be combined with any of the other embodiments in this specification as appropriate.

(Embodiment 3)

A configuration example of a memory device of one embodiment of the present invention is described with reference to FIG. 9.

Figure 9:
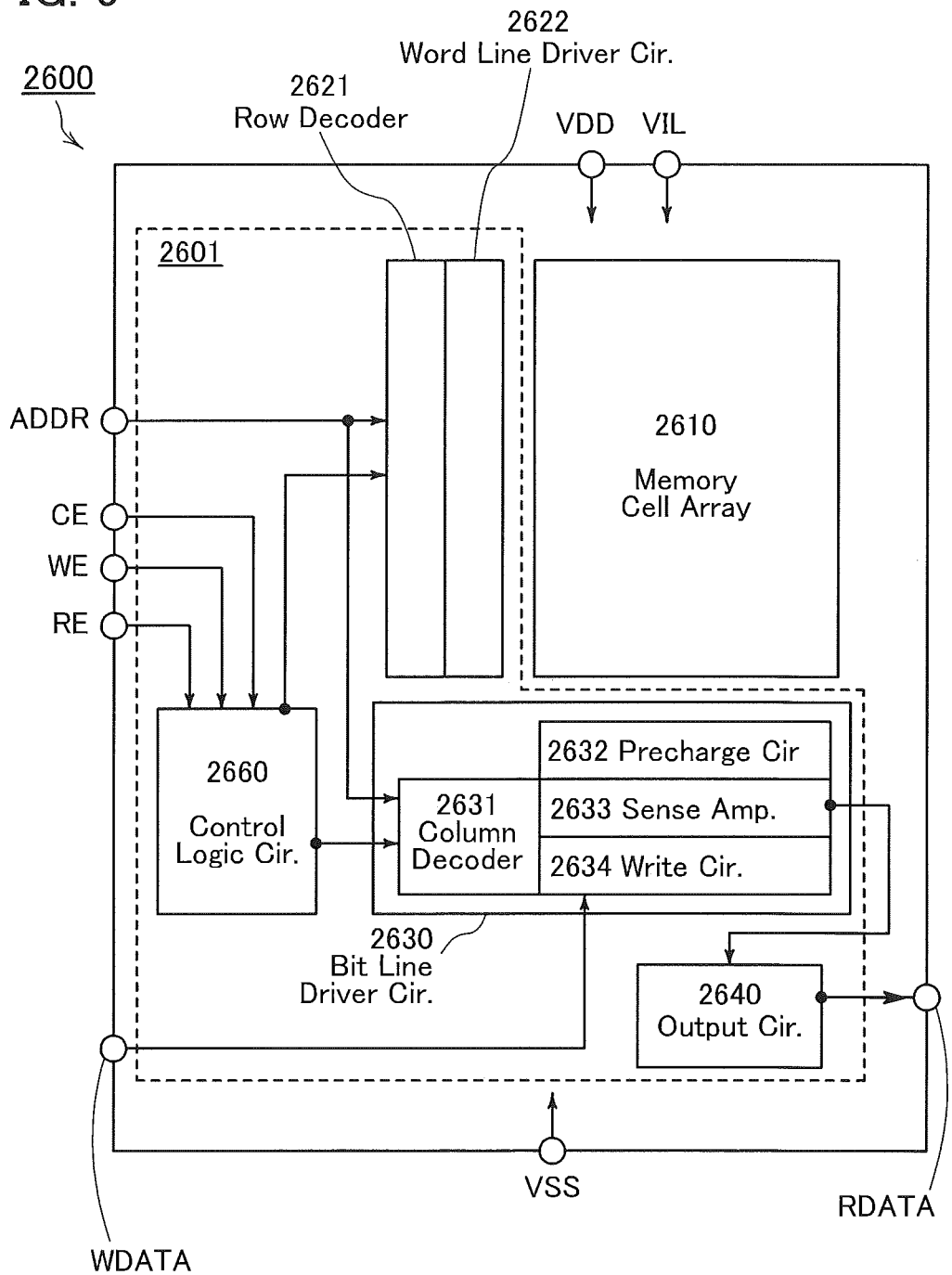
FIG. 9 is a block diagram illustrating an example of a memory device.

FIG. 9 shows one example of a structure of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging the wirings RBL, BL, and SL that are described in Embodiments 1 and 2 and are not illustrated in FIG. 9. The sense amplifier 2633 has a function of amplifying a data signal read from the wirings RBL, BL, and SL. The amplified data signal is output as a digital data signal RDATA to the outside of the memory device 2600 through the output circuit 2640.

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, RE) that are input from the outside, and generates control signals for the row decoder 2621 and the column decoder 2631. The signal CE is a chip enable signal, the signal WE is a write enable signal, and the signal RE is a read enable signal. Signals processed by the control logic circuit 2660 are not limited to those listed above, and other control signals may be input as necessary.

Note that whether each circuit or each signal described above is provided or not can be determined as appropriate as needed.

When a p-channel Si transistor and a transistor including a channel formation region using an oxide semiconductor (preferably an oxide containing In, Ga, and Zn) described in the following embodiment are used in the memory device 2600, the memory device 2600 can be reduced in size. In addition, the memory device 2600 can be reduced in power consumption. Furthermore, the memory device 2600 can be increased in operating speed. In particular, by using only a p-channel transistor as the Si-transistor, manufacturing costs can be reduced.

Note that the configuration of this embodiment is not limited to that shown in FIG. 9. The configuration may be changed as appropriate; for example, part of the peripheral circuit 2601, e.g., the precharge circuit 2632 and/or the sense amplifier 2633 may be provided below the memory cell array 2610.

Note that this embodiment can be combined with any of the other embodiments in this specification as appropriate.

(Embodiment 4)

In this embodiment, the CPU core 101 described in Embodiment 1 is described.

Figure 10:
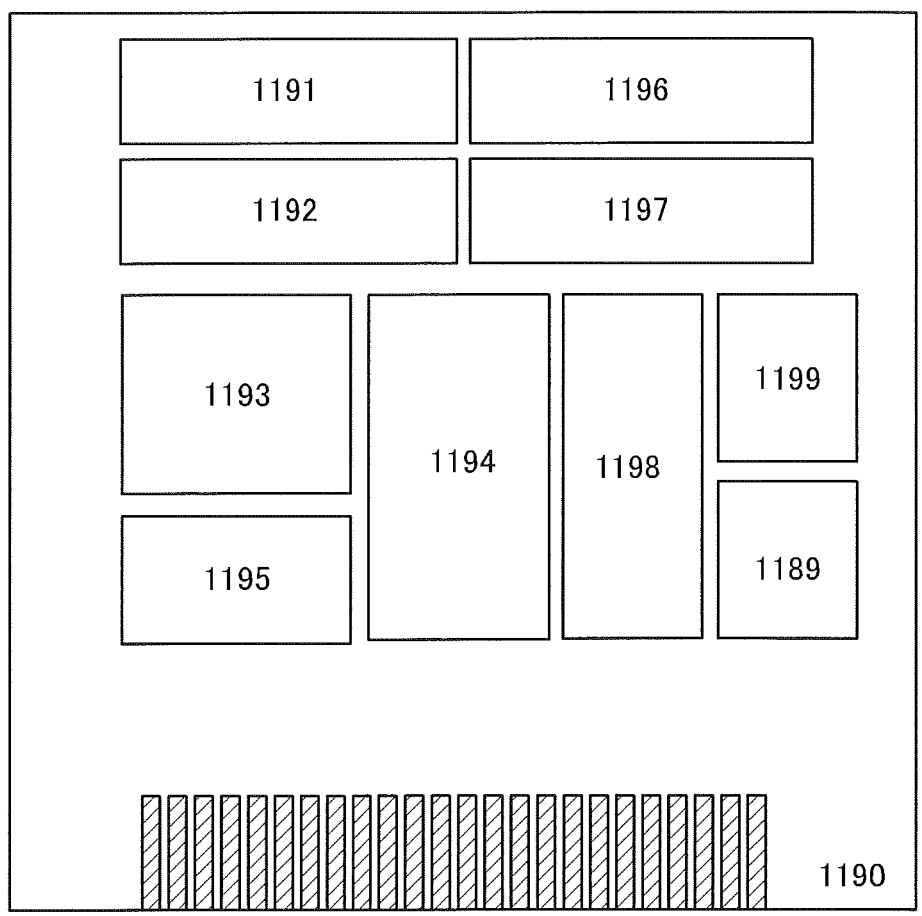
FIG. 10 is a block diagram illustrating a configuration example of a CPU core.

FIG. 10 is a block diagram showing a configuration example of the CPU core 101.

The CPU illustrated in FIG. 10 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 10 is just an example in which the configuration has been simplified, and an actual CPU may have a variety of configurations depending on the application. For example, the CPU may have the following configuration: a structure including the CPU illustrated in FIG. 10 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 10, a memory cell is provided in the register 1196. For the memory cell of the register 1196, the transistor described in the above embodiment can be used.

In the CPU illustrated in FIG. 10, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Note that this embodiment can be combined with any of the other embodiments in this specification as appropriate.

(Embodiment 5)

In this embodiment, examples in which the semiconductor device described in any of the above embodiments is used as a memory device in an electronic component and in an electronic device including the electronic component are described with reference to FIGS. 11A to 11E and FIGS. 12A to 12H.

<Electronic Component>

FIG. 11A shows an example in which the semiconductor device described in any of the above embodiments is used as a memory device in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors described in Embodiments 1 and 3 is completed through an assembly process (post-process) of integrating detachable components on a printed board.

The post-process can be finished through the steps in FIG. 11A. Specifically, after an element substrate obtained in the proceeding process is completed (Step STP1), a rear surface of the substrate is ground (Step STP2). The substrate is thinned in this step to reduce warpage or the like of the substrate in the proceeding process and to reduce the size of the component itself.

After the rear surface of the substrate is ground, a dicing step is performed to divide the substrate into a plurality of chips. Then, the divided chips are separately picked up, placed on a lead frame, and bonded thereto in a die bonding step (Step STP3). In this die bonding process, the chip is bonded to the lead frame by an appropriate method depending on a product, for example, bonding with a resin or a tape. Note that in the die bonding process, the chip may be mounted on an interposer to be bonded.

Note that in this embodiment, when an element is formed on a surface of a substrate, the other surface is referred to as a rear surface (a surface on which the element is not formed).

Next, wiring bonding for electrically connecting a lead of the lead frame and an electrode on a chip through a metal wire is performed (Step STP4). A silver line or a gold line can be used as the metal fine line. Ball bonding or wedge bonding can be used as the wire bonding.

A wire-bonded chip is subjected to a molding step of sealing the chip with an epoxy resin or the like (Step STP5). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP6). This plate processing prevents rust of the lead and facilitates soldering at the time of mounting the chip on a printed wiring board in a later step.

Next, printing (marking) is performed on a surface of the package (Step STP7). After a final testing step (Step STP8), the electronic component is completed (Step STP9).

The above electronic component can include the semiconductor device described in the above embodiment. Thus, a highly reliable electronic component can be obtained.

FIG. 11B is a schematic perspective view of the completed electronic component. FIG. 11B shows a schematic perspective diagram of a quad flat package (QFP) as an example of the electronic component. An electronic component 4700 in FIG. 11B includes a lead 4701 and a circuit portion 4703. The electronic component 4700 in FIG. 11B is mounted on a printed board 4702, for example. A plurality of electronic components 4700 that are combined and electrically connected to each other over the printed board 4702 can be mounted on an electronic device. A completed circuit board 4704 is provided in an electronic device or the like.

One embodiment of the present invention is not limited to the shape of the electronic component 4700, and the element substrate fabricated in Step STP1 is included. In addition, the element substrate of one embodiment of the present invention includes an element substrate that has been subjected to Step STP2 where the rear surface of the substrate is ground. For example, a semiconductor wafer 4800 or the like shown in FIG. 11C corresponds to the element substrate. In the semiconductor wafer 4800, a plurality of circuit portions 4802 are formed on a top surface of a wafer 4801. A part without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. To perform the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 are intersected perpendicularly with each other.

With the dicing step, a chip 4800a as shown in FIG. 11D can be cut out from the semiconductor wafer 4800. The chip 4800a includes a wafer 4801a, the circuit portion 4802, and a spacing 4803a. Note that it is preferable to provide the spacing 4803a to be made as small as possible. In this case, it is preferable that the width of the spacing 4803 between adjacent circuit portions 4802 be substantially the same as a length of margin for cutting of the scribe line SCL1 or the scribe line SCL2.

The shape of the element substrate of one embodiment of the present invention is not limited to the shape of the semiconductor wafer 4800 shown in FIG. 11C. For example, a rectangular semiconductor wafer 4810 shown in FIG. 11E can be employed. The shape of the element substrate can be changed as appropriate, depending on a process for fabricating an element and an apparatus for fabricating an element.

<Electronic Device>

Next, electronic devices including the aforementioned electronic component are described.

A semiconductor device of one embodiment of the present invention can be used for a display device, a personal computer, or an image reproducing devices provided with recording media (typically, devices that reproduce the content of recording media such as digital versatile discs (DVDs) and have displays for displaying the reproduced images). Other than the above, as electronic devices that can be equipped with the semiconductor device of one embodiment of the present invention, mobile phones, portable game machines, portable information terminals, e-book readers, cameras such as video cameras or digital still cameras, goggle-type displays (head mounted displays), navigation systems, audio reproducing devices (e.g., car audio players and digital audio players), copiers, facsimiles, printers, multifunction printers, automated teller machines (ATM), vending machines, medical devices, and the like can be given. FIGS. 12A to 12H illustrate specific examples of these electronic devices.

Figure 12A:
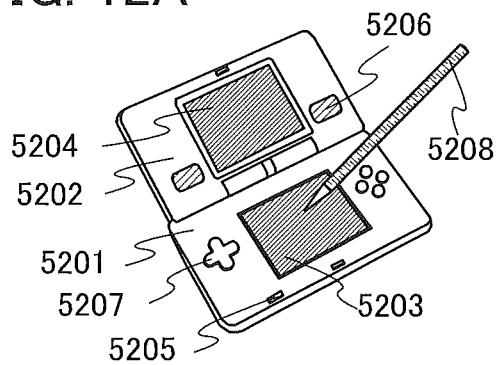
FIGS. 12A to 12H are perspective views illustrating examples of an electronic device.

FIG. 12A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 12A has the two display portions 5203 and 5204, the number of display portions included in a portable game machine is not limited to this.

Figure 12B:
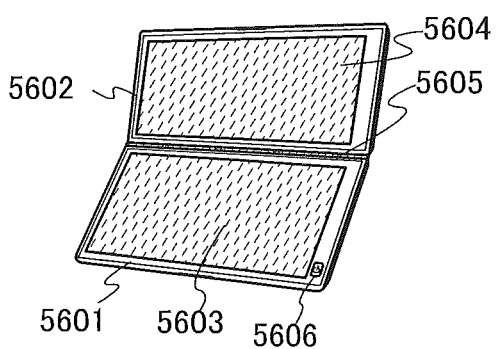

FIG. 12B illustrates a personal digital assistant, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 12C:
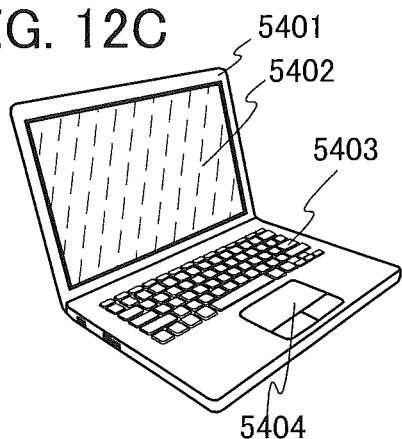

FIG. 12C illustrates a notebook personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 12D:
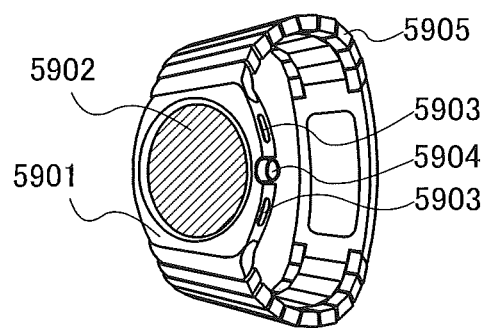

FIG. 12D illustrates a smart watch that is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used as a display portion 5902. Note that the position input function can be added by provision of a touch panel in a display device. Alternatively, the position input function can be added by providing a photoelectric conversion element called a photosensor in a pixel area of a display device. As the operation buttons 5903, any one of a power switch for starting the smart watch, a button for operating an application of the smart watch, a volume control button, a switch for turning on or off the display portion 5902, and the like can be used. Although the smart watch in FIG. 12D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for time adjustment. Although the smart watch illustrated in FIG. 12D includes the operator 5904, one embodiment of the present invention is not limited thereto and the operator 5904 is not necessarily provided.

Figure 12E:
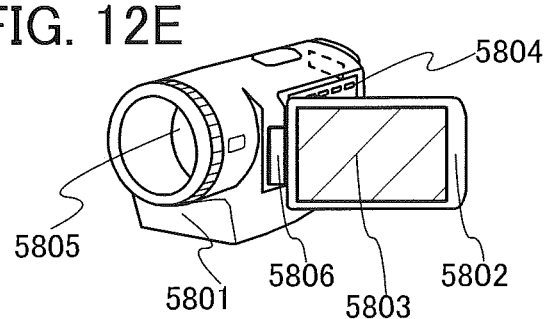

FIG. 12E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 12F:
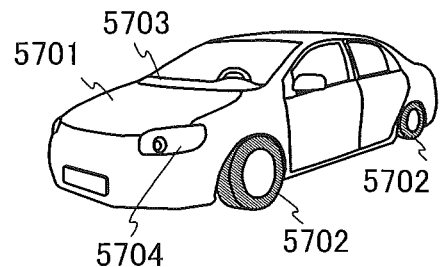

FIG. 12F illustrates a passenger car including a car body 5701, wheels 5702, a dashboard 5703, lights 5704, and the like. The semiconductor device of one embodiment of the present invention can be used for a variety of integrated circuits included in cars.

Figure 12G:
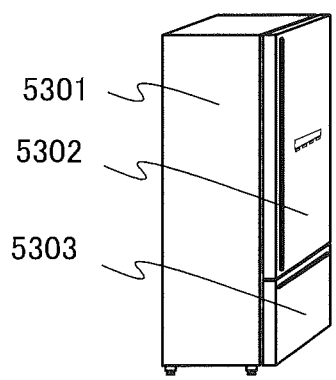

FIG. 12G illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 12H:
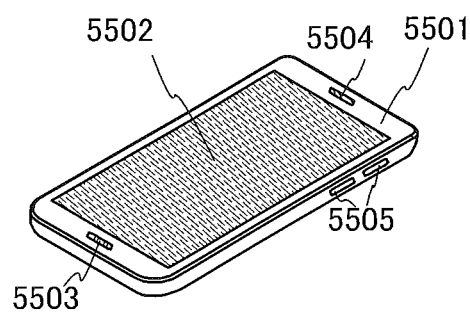

FIG. 12H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 12H includes two operation buttons 5505, the number of the operation buttons included in the mobile phone is not limited to two. Although not illustrated, the mobile phone illustrated in FIG. 12H may be provided with a camera. Although not illustrated, the mobile phone illustrated in FIG. 12H may include a light-emitting device used for a flashlight or a lighting purpose. Although not illustrated, the mobile phone in FIG. 12H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 12H is determined by providing a sensing device that includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device that is a device including a display element, a light-emitting element, and a light-emitting device that is a device including a light-emitting element can employ a variety of modes or can include a variety of elements. For example, the display element, the display device, the light-emitting element, or the light-emitting device includes at least one of an electroluminescence (EL) element (e.g., an EL element including organic and inorganic materials, an organic EL element, or an inorganic EL element), a light-emitting diode (LED) chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulation (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by electric or magnetic action may be included in the display element, the display device, the light-emitting element, or the light-emitting device. Note that examples of display devices having EL elements include an EL display. Examples of display devices including electron emitters are a field emission display (FED) and a surface-conduction electron-emitter display (SED). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including micro electro mechanical systems (MEMS), a drying agent may be provided in a space where the display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

(Embodiment 6)

The memory device of one embodiment of the present invention can be used for removable memory devices such as memory cards (e.g., SD cards), universal serial bus (USB) memories, and solid state drives (SSD). In this embodiment, some structure examples of the removable memory device are described with reference to FIGS. 13A to 13E.

Figure 13A:
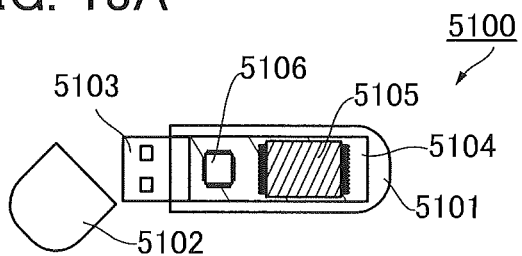
FIGS. 13A to 13E are perspective views illustrating examples of an electronic device.

FIG. 13A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5105. Specifically, a processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5105 but the controller chip 5106. The USB connector 5103 functions as an interface for connection to an external device.

Figure 13B:
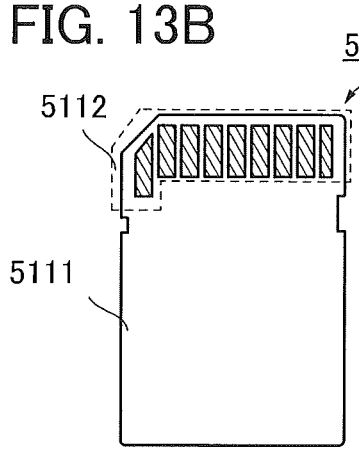
Figure 13C:
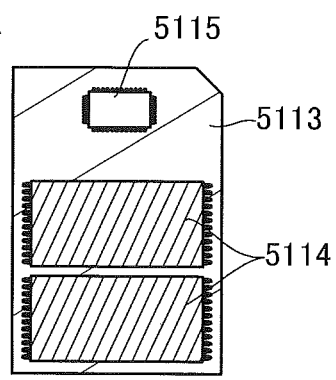

FIG. 13B is a schematic external diagram of an SD card, and FIG. 13C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5114. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions. For example, the word line driver circuit 2622, the row decoder 2621, the sense amplifier 2633, the precharge circuit 2632, and the column decoder 2631 may be incorporated into not the memory chip 5114 but the controller chip 5115.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 13D:
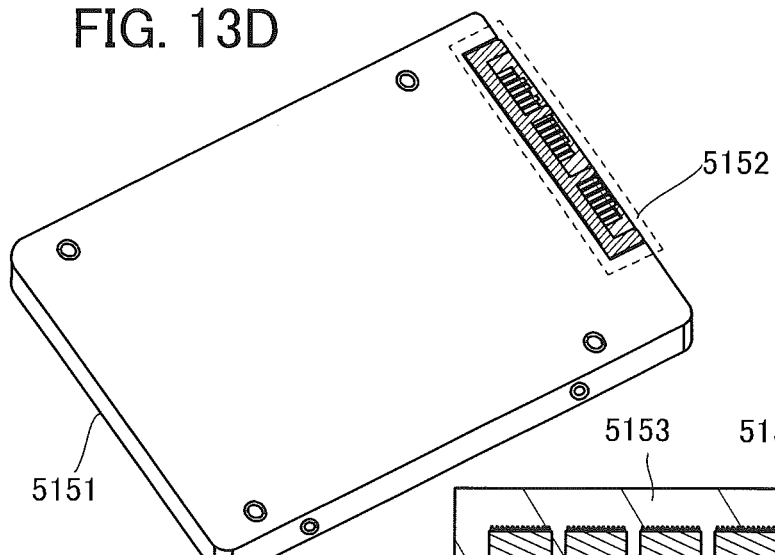
Figure 13E:
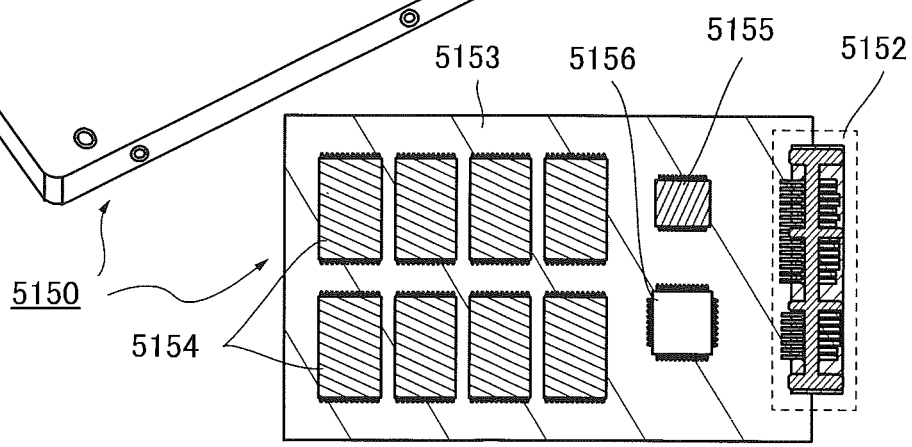
Figure 14A:
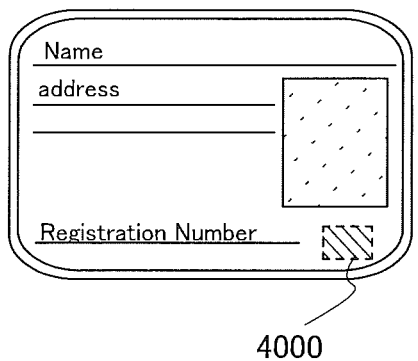
FIGS. 14A to 14F are perspective views showing application examples of an RF tag.
Figure 14B:
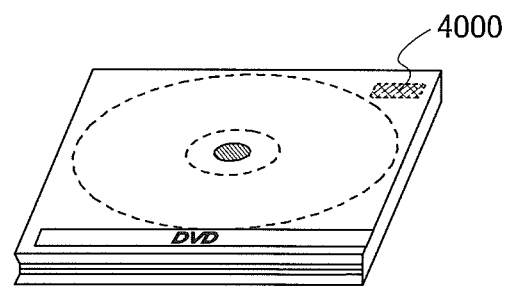
Figure 14C:
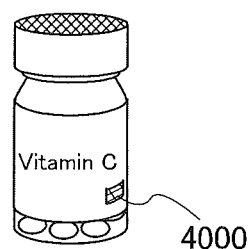
Figure 14D:
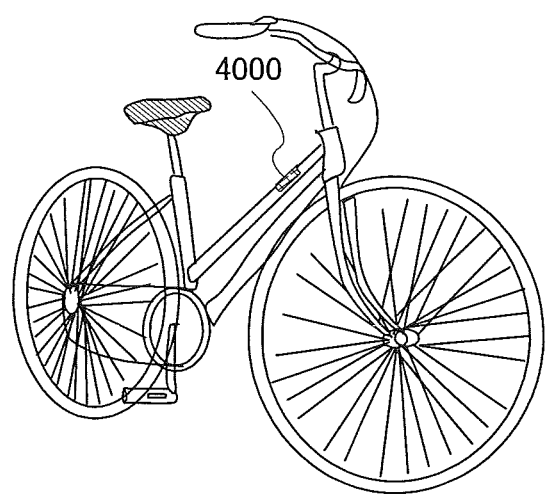
Figure 14E:
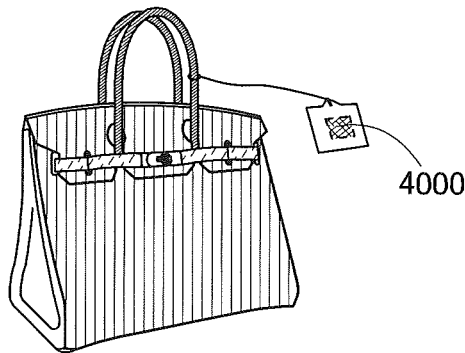
Figure 14F:
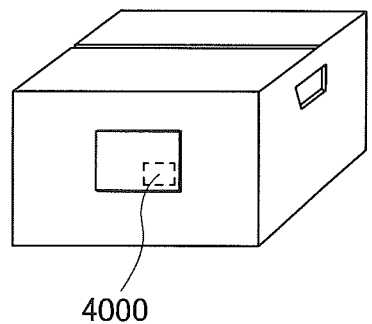

FIG. 13D is a schematic external diagram of an SSD, and FIG. 13E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. The memory cell array 2610, the word line driver circuit 2622, the row decoder 2621, the sense amplifier 2633, the precharge circuit 2632, the column decoder 2631, and the like, described in Embodiment 3, are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with any of the other embodiments in this specification as appropriate.
(Embodiment 7)

In this embodiment, application examples of an RF tag that can include the memory device of one embodiment of the present invention are described with reference to FIGS. 14A to 14F. The RF tag is widely used and can be provided for, for example, products such as bills, coins, securities, bearer bonds, documents (e.g., driver's licenses or resident's cards, see FIG. 14A), recording media (e.g., DVD or video tapes, see FIG. 14B), packaging containers (e.g., wrapping paper or bottles, see FIG. 14C), vehicles (e.g., bicycles, see FIG. 14D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 14E and 14F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.
(Embodiment 8)

Described in this embodiment are transistors of one embodiment of the disclosed invention.

Transistors of one embodiment of the present invention each preferably include a nanocrystalline oxide semiconductor (nc-OS) or a c-axis-aligned crystalline oxide semiconductor (CAAC-OS), which is described in Embodiment 9.

<Structure Example 1 of Transistor>

Figure 15A:
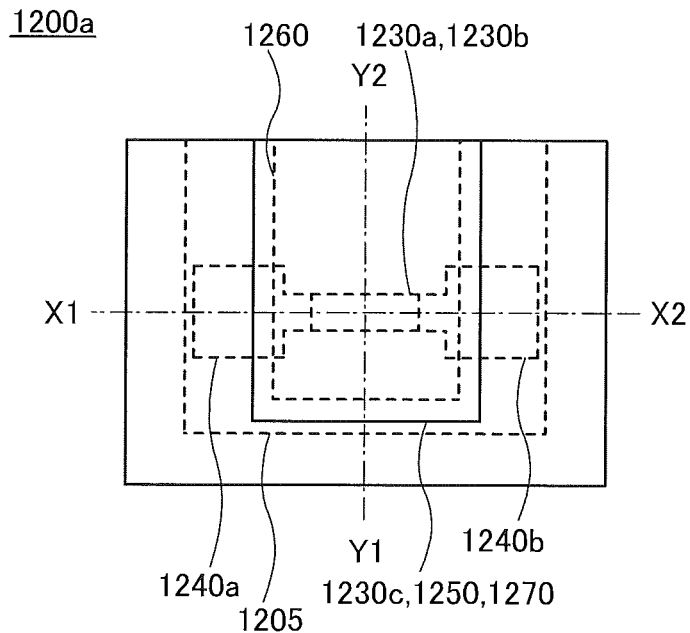
FIGS. 15A to 15C are a top view and cross-sectional views illustrating a structural example of a transistor.
Figure 15B:
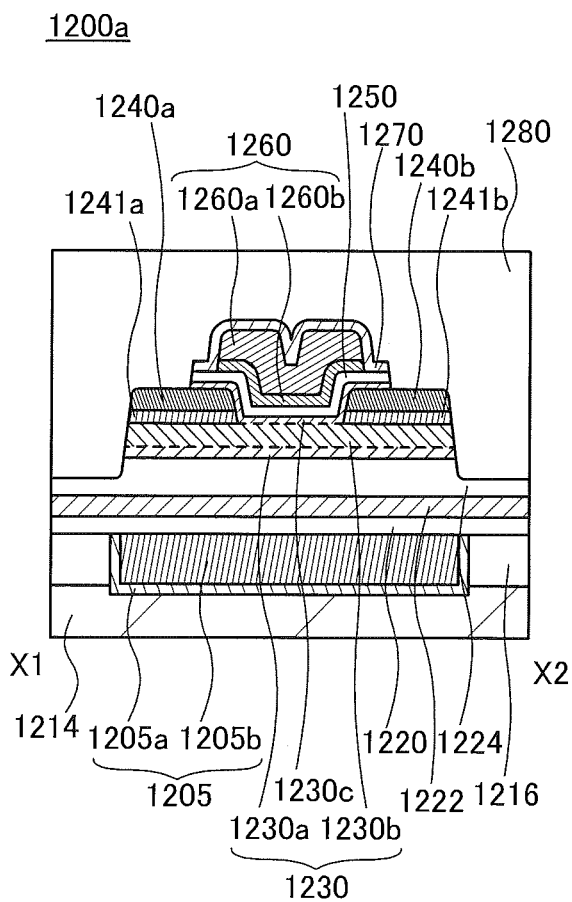
Figure 15C:
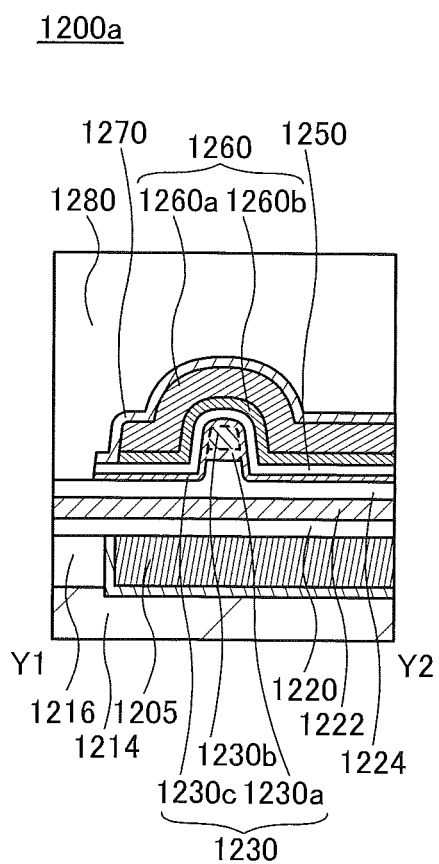

An example of a transistor of one embodiment of the present invention is described below. FIGS. 15A to 15C are a top view and cross-sectional views of a transistor of one embodiment of the present invention. FIG. 15A is a top view. FIG. 15B is a cross-sectional view taken along dashed-dotted line X1-X2 in FIG. 15A. FIG. 15C is a cross-sectional view taken along dashed-dotted line Y1-Y2 in FIG. 15A. Note that for simplification of the drawing, some components in the top view in FIG. 15A are not illustrated.

A transistor 1200*a* includes a conductor 1205 and a conductor 1260 that function as gate electrodes; an insulator 1220, an insulator 1222, an insulator 1224, and an insulator 1250 that function as gate insulating layers; a metal oxide 1230 that includes a region where a channel is formed; a conductor 1240*a* and a conductor 1241*a* that function as one of a source and a drain; a conductor 1240*b* and a conductor 1241*b* that function as the other of the source and the drain; an insulator 1214; an insulator 1216; an insulator 1270; and the insulator 1280 that includes excess oxygen.

The metal oxide 1230 includes a metal oxide 1230*a*, a metal oxide 1230*b* over the metal oxide 1230*a*, and a metal oxide 1230*c* over the metal oxide 1230*b*. When the transistor 1200*a* is turned on, current flows (a channel is formed) mainly in the metal oxide 1230*b*. Although current sometimes flow through a region in the vicinity of the interface (a mixed region in some cases) between the metal oxide 1230*b* and the metal oxides 1230*a* and 1230*c*, the metal oxides 1230*a* and 1230*c* function as insulators at the other region.

«Interlayer Insulating Film and Protective Insulating Film»

The insulator 1214 is preferably formed using a material that has a barrier property with respect to hydrogen or oxygen. As an example of the film having a barrier property with respect to hydrogen, silicon nitride formed by a CVD method can be used for the insulator 1214. As the insulator 1214, metal oxide such as aluminum oxide, hafnium oxide, or tantalum oxide is preferably used, for example. In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 1200a in and after a manufacturing process of the transistor. In addition, release of oxygen from the metal oxide in the transistor 1200a can be prevented. Therefore, aluminum oxide is suitably used as a protective film for the transistor 1200a.

The insulator 1216 is provided over the insulator 1214. The insulator 1216 is formed using a material such as silicon oxide, silicon oxynitride, silicon nitride oxide, silicon nitride, aluminum oxide, aluminum oxynitride, aluminum nitride oxide, or aluminum nitride.

Each of the insulators 1220 and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with a metal oxide in the transistor 1200a, oxygen vacancies in the metal oxide can be compensated. Note that the insulators 1222 and 1224 are not necessarily formed of the same material.

The insulator 1222 preferably has a single-layer structure or a layered structure formed using an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Note that the insulator 1222 may have a layered structure of two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a large number of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide metal in the transistor 1200a to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200a having the structure is a normally-off transistor that is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 1220 and 1224 are formed using silicon oxide and the insulator 1222 is formed using hafnium oxide, the insulators 1220 and 1224 may be formed by a chemical vapor deposition method (including a CVD method and an atomic layer deposition (ALD) method) and the insulator 1222 may be formed by a sputtering method. Note that using a sputtering method for the formation of the insulator 1222 might easily crystallize the insulator 1222 at low temperature to generate a large amount of fixed charges.

The threshold voltages can be controlled by appropriate adjustment of the thicknesses of the insulator 1220, the insulator 1222, and the insulator 1224. A transistor having a low leakage current in an off state can be provided. A transistor with stable electrical characteristics can be provided. A transistor having high on-state current can be provided. A transistor having a small subthreshold swing value can be provided. A highly reliable transistor can be provided. The materials of the insulator 1220, the insulator 1222, and the insulator 1224 are preferably a 10-nm-thick silicon oxynitride film, a 20-nm-thick aluminum oxide film, and a 30-nm-thick silicon oxynitride film, respectively. It is further preferable to use a 5-nm-thick silicon oxynitride film, a 5-nm-thick aluminum oxide film, and a 5-nm-thick silicon oxynitride film.

The insulator 1222 is preferably formed using a material having a barrier property with respect to oxygen and hydrogen. When such a material is used, release of oxygen from the metal oxide in the transistor 1200a or entry of an impurity such as hydrogen from the outside can be prevented.

The insulator 1250 can have a single-layer structure or a stacked-layer structure using, for example, one or more of an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 1250, like the insulator 1224, an oxide insulator that contains oxygen in excess of that in the stoichiometric composition is preferably used. When such an insulator containing excess oxygen is provided in contact with the metal oxide 1230, oxygen vacancies in the metal oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator 1250 formed of such a material serves as a layer that prevents release of oxygen from the metal oxide 1230 and entry of an impurity such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons is trapped by electron trap states, the threshold voltage of the transistor 1200a can be shifted in the positive direction. The transistor 1200a having the structure is a normally-off transistor that is in a non-conduction state (also referred to as an off state) even when the gate voltage is 0 V.

In addition to the insulator 1250, a barrier film may be provided between the metal oxide 1230 and the conductor 1260 in the transistor illustrated in FIGS. 15A to 15C. Alternatively, the metal oxide 1230c may have a barrier property.

For example, an insulating film containing excess oxygen is provided in contact with the metal oxide 1230 and covered by a barrier film, whereby the composition of the metal oxide can be almost the same as the stoichiometric composition or can be in a supersaturated state containing more oxygen than that in the stoichiometric composition. It is also possible to prevent entry of an impurity such as hydrogen into the metal oxide 1230.

The insulator 1270 may be provided to cover the conductor 1260. In the case where the insulator 1280 is formed using an oxide material from which oxygen is released, the insulator 1270 is formed using a substance having a barrier property with respect to oxygen to prevent the conductor 1260 from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

Thus, the oxidation of the conductor 1260 can be prevented, and oxygen released from the insulator 1280 can be supplied to the metal oxide 1230 efficiently.

«Metal Oxide»

The metal oxide 1230 according to the present invention is described below.

A metal oxide used as the metal oxide 1230 preferably contains at least indium or zinc. In addition, aluminum, gallium, yttrium, tin, or the like is preferably contained. As the metal oxide 1230, indium gallium oxide or indium zinc oxide may be used. Furthermore, the metal oxide 1230 may contain one or more elements selected from boron, silicon, titanium, iron, nickel, germanium, zirconium, molybdenum, lanthanum, cerium, neodymium, hafnium, tantalum, tungsten, magnesium, and the like.

Here, the case where a metal oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in the metal oxide according to the present invention are described with reference to FIGS. 18A to 18C. Note that the proportion of oxygen atoms is not illustrated in FIGS. 18A to 18C. The terms of the atomic ratio of indium, the element M, and zinc contained in the oxide are denoted by [In], [M], and [Zn], respectively.

In FIGS. 18A to 18C, broken lines indicate a line where the atomic ratio [In]:[M]:[Zn] is $(1+\alpha):(1-\alpha):1$ where $\alpha$ is a real number greater than or equal to $-1$ and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines correspond to a line representing the atomic ratio of [In]:[M]:[Zn]=1:1:$\beta$ where $\beta$ is a real number greater than or equal to 0, a line representing the atomic ratio of [In]:[M]:[Zn]=1:2:$\beta$, a line representing the atomic ratio of [In]:[M]:[Zn]=1:3:$\beta$, a line representing the atomic ratio of [In]:[M]:[Zn]=1:4:$\beta$, a line representing the atomic ratio of [In]:[M]:[Zn]=2:1:$\beta$, and a line representing the atomic ratio of [In]:[M]:[Zn]=5:1:$\beta$.

A metal oxide having the atomic ratio of [In]:[M]:[Zn]=0:2:1 or a neighborhood thereof in FIGS. 18A to 18C tends to have a spinel crystal structure.

FIGS. 18A and 18B illustrate examples of the preferred ranges of the atomic ratio of indium, the element M, and zinc contained in the metal oxide of one embodiment of the present invention.

Figure 19:
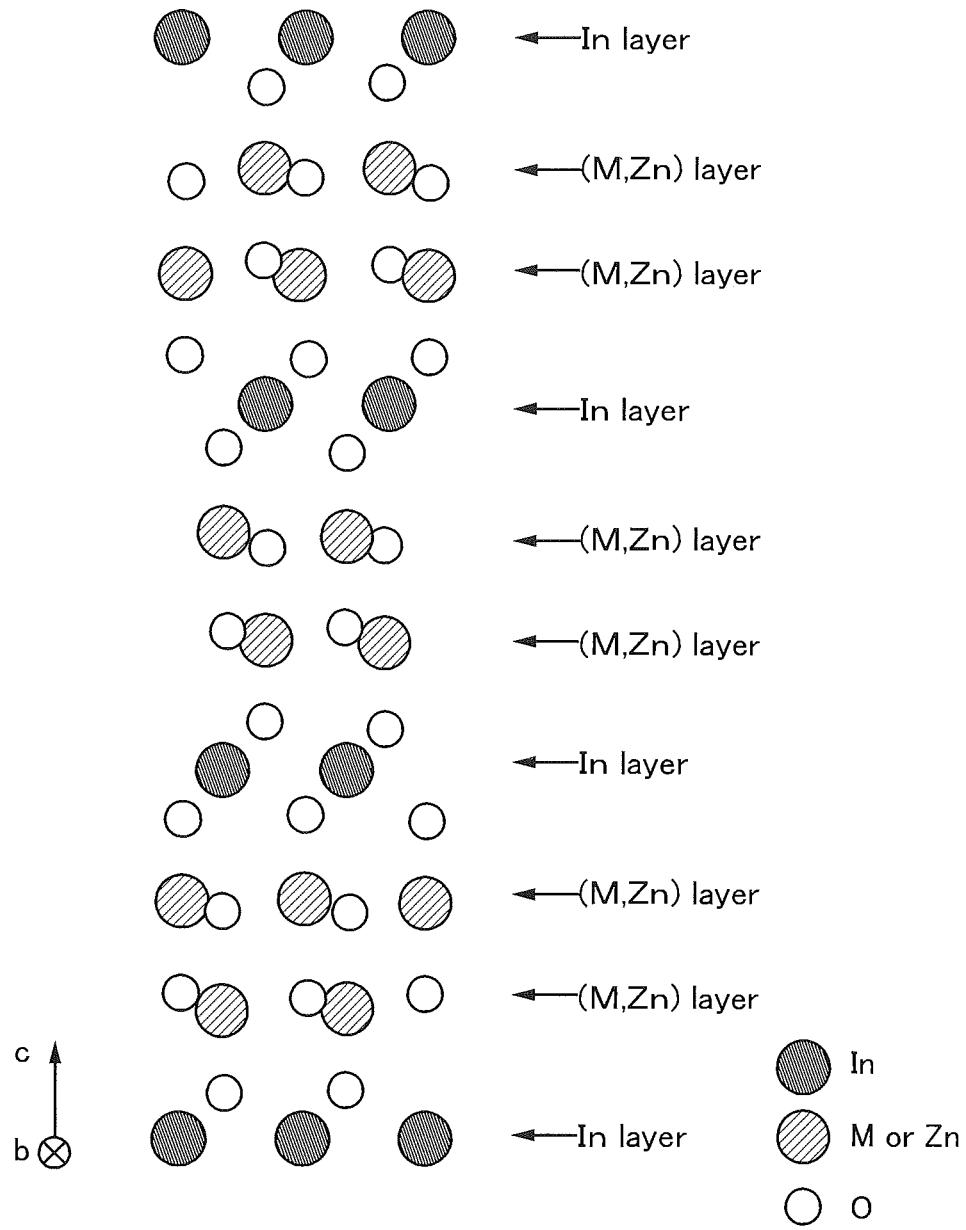
FIG. 19 illustrates a crystal of $In/MZnO_4$.

FIG. 19 illustrates an example of the crystal structure of InMZnO$_4$ whose atomic ratio [In]:[M]:[Zn] is 1:1:1. The crystal structure illustrated in FIG. 19 is InMZnO$_4$ observed from a direction parallel to a b-axis. Note that a metal element in a layer that contains M, Zn, and oxygen (hereinafter this layer is referred to as an "(M,Zn) layer") in FIG. 19 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes two (M,Zn) layers that contain the element M, zinc, and oxygen with respect to one layer that contains indium and oxygen (hereinafter referred to as an In layer), as illustrated in FIG. 19.

Indium and the element M can be replaced with each other. Therefore, when the element Min the (M,Zn) layer is replaced with indium, the layer can also be referred to as an (In,M,Zn) layer. In that case, a layered structure that includes two (In,M,Zn) layers with respect to one In layer is obtained.

A metal oxide whose atomic ratio [In]:[M]:[Zn] is 1:1:2 has a layered structure that contains three (M,Zn) layers with respect to one In layer. In other words, if [Zn] is larger than [In] and [M], the proportion of (M,Zn) layers to In layers becomes higher when the metal oxide is crystallized.

Note that in the case where the number of (M,Zn) layers with respect to one In layer is not an integer in the metal oxide, the metal oxide might have a plurality of kinds of layered structures where the number of (M,Zn) layers with respect to one In layer is an integer. For example, in the case of [In]: [M]: [Zn]=1:1:1.5, the oxide semiconductor might have the following layered structures: a layered structure of two (M,Zn) layers with respect to one In layer and a layered structure of three (M,Zn) layers with respect to one In layer.

For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

In addition, the metal oxide containing indium in a higher proportion can have a higher carrier mobility (electron mobility). This is because in a metal oxide containing indium, the element M, and zinc, the s orbital of heavy metal mainly contributes to carrier transfer, and when the indium content in the metal oxide is increased, overlaps of the s orbitals of indium atoms are increased; therefore, a metal oxide having a high content of indium has a higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and the neighborhood thereof (e.g., a region C in FIG. 18C), insulation performance becomes better.

Accordingly, a metal oxide of one embodiment of the present invention preferably has an atomic ratio represented by a region A in FIG. 18A. With the atomic ratio, a layered structure with high carrier mobility and a few grain boundaries is easily obtained.

A region B in FIG. 18B represents an atomic ratio of [In]:[M]:[Zn]=4:2:3 to 4:2:4.1 and the neighborhood thereof. The neighborhood includes an atomic ratio of [In]:[M]:[Zn]=5:3:4. A metal oxide with an atomic ratio represented by the region B is an excellent metal oxide that has particularly high crystallinity and high carrier mobility.

Note that the condition where a metal oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which a metal oxide has a layered structure, and boundaries of the regions A to C are not clear.

Next, the case where the metal oxide is used for a transistor is described.

Note that when the metal oxide is used for a transistor, carrier scattering or the like at a grain boundary can be reduced; thus, the transistor can have high field-effect mobility. In addition, the transistor can have high reliability.

A metal oxide with low carrier density is preferably used for the transistor. For example, the metal oxide has a carrier density lower than $8\times10^{11}$ cm$^{-3}$, preferably lower than $1\times10^{11}$ cm$^{-3}$, further preferably lower than $1\times10^{10}$ cm$^{-3}$ and higher than or equal to $1\times10^{-9}$ cm$^{-3}$.

A highly purified intrinsic or substantially highly purified intrinsic metal oxide has few carrier generation sources, and thus can have a low carrier density. A highly purified intrinsic or substantially highly purified intrinsic metal oxide has a low density of defect states and accordingly has low density of trap states in some cases.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the metal oxide is described.

When silicon or carbon that is one of Group 14 elements is contained in the metal oxide, defect states are formed in the metal oxide. Thus, the metal oxide is formed to have a region where the concentration of silicon or carbon (measured by secondary ion mass spectrometry (SIMS)) is controlled to be lower than or equal to $2\times10^{18}$ atoms/cm$^3$, preferably lower than or equal to $2\times10^{17}$ atoms/cm$^3$ in the metal oxide or around an interface with the oxide.

When the metal oxide contains alkali metal or alkaline earth metal, defect states are formed and carriers are generated, in some cases. Thus, a transistor including a metal oxide that contains alkali metal or alkaline earth metal is likely to be normally-on. Therefore, it is preferable to reduce the concentration of alkali metal or alkaline earth metal in the metal oxide. Specifically, the concentration of alkali metal or alkaline earth metal in the metal oxide, which is measured by SIMS, is lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase of carrier density. Thus, when a metal oxide contains nitrogen, a transistor in which the metal oxide is used for a semiconductor is likely to be normally on. For this reason, nitrogen in the metal oxide is preferably reduced as much as possible; the nitrogen concentration of the metal oxide, which is measured by SIMS, is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including a metal oxide that contains hydrogen is likely to be normally-on. Accordingly, hydrogen in the metal oxide is preferably reduced as much as possible. Specifically, the hydrogen concentration of the metal oxide, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide with sufficiently reduced impurity concentration is used for a channel region in a transistor, the transistor can have stable electrical characteristics.

Next, the case where the metal oxide has a two-layer structure or a three-layer structure is described. A band diagram of a stacked-layer structure of a metal oxide S1, a metal oxide S2, and a metal oxide S3 and insulators that are in contact with the stacked-layer structure and a band diagram of a stacked-layer structure of the metal oxides S1 and S2 and insulators that are in contact with the stacked-layer structure are described with reference to FIGS. 20A and 20B.

Figure 20A:
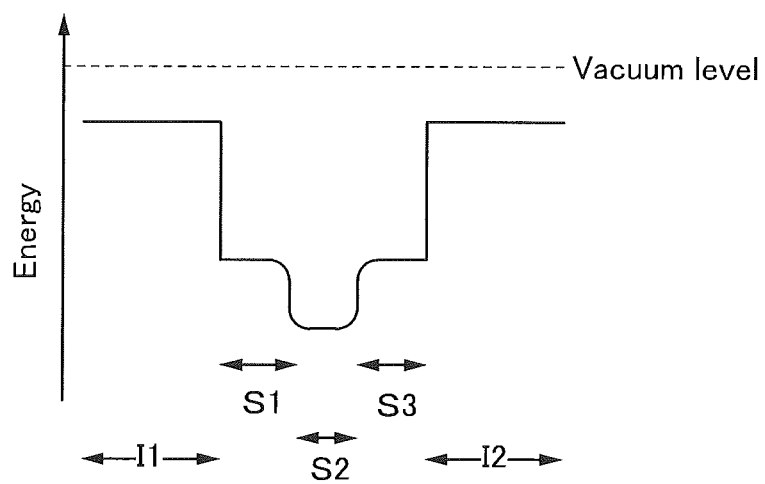
FIGS. 20A and 20B are band diagrams of a layered structure of oxides.
Figure 20B:
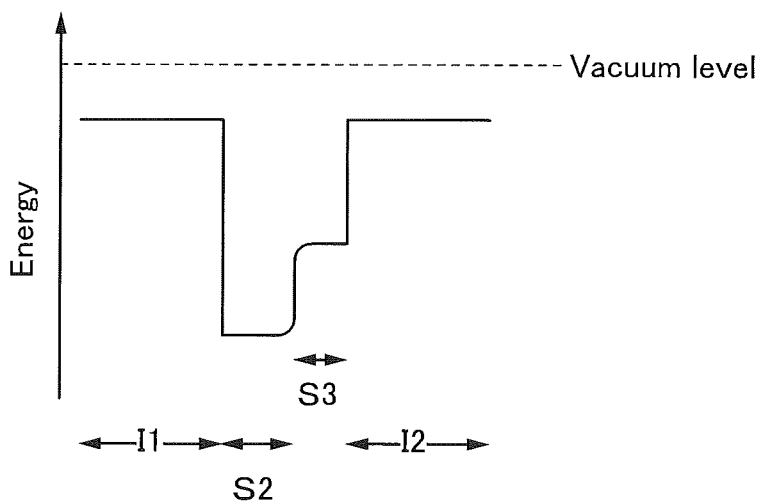

FIG. 20A is an example of a band diagram of a layered structure including an insulator I1, the metal oxide S1, the metal oxide S2, the metal oxide S3, and an insulator I2 in a thickness direction. FIG. 20B is an example of a band diagram of a layered structure including the insulator I1, the metal oxide S2, the metal oxide S3, and the insulator I2 in a thickness direction. Note that for easy understanding, the band diagrams show the conduction band minimum (Ec) of each of the insulator I1, the metal oxide S1, the metal oxide S2, the metal oxide S3, and the insulator I2.

The energy level of the conduction band minimum of each of the metal oxides S1 and S3 is closer to the vacuum level than that of the metal oxide S2 is. Typically, the energy level of the conduction band minimum of the metal oxide S2 is preferably lower than that of each of the metal oxides S1 and S3. Specifically, a difference in the energy level between the conduction band minimum of the metal oxide S2 and the conduction band minimum of the metal oxide S1 is preferably greater than or equal to 0.15 eV and less than or equal to 2 eV, further preferably greater than or equal to 0.5 eV and less than or equal to 1 eV. In addition, a difference in the energy level between the conduction band minimum of the metal oxide S2 and the conduction band minimum of the metal oxide S3 is preferably greater than or equal to 0.15 eV and less than or equal to 2 eV, further preferably greater than or equal to 0.5 eV and less than or equal to 1 eV. That is, it is preferable that the electron affinity of the metal oxide S2 be higher than the electron affinity of each of the metal oxides S1 and S3, and the difference between the electron affinity of each of the metal oxides S1 and S3 and the electron affinity of the metal oxide S2 be greater than or equal to 0.15 eV and less than or equal to 2 eV, further preferably greater than or equal to 0.5 eV and less than or equal to 1 eV.

As illustrated in FIGS. 20A and 20B, the conduction band minimum of each of the metal oxides S1 to S3 is gradually varied. In other words, the energy level of the conduction band minimum is continuously changed or continuously connected. In order to obtain such a band diagram, the density of defect states in a mixed layer formed at an interface between the metal oxides S1 and S2 or an interface between the metal oxides S2 and S3 is preferably made low.

Specifically, when the metal oxides S1 and S2 or the metal oxides S2 and S3 contain the same element (as a main component) in addition to oxygen, a mixed layer with a low density of defect states can be formed. For example, in the case where the metal oxide S2 is an In—Ga—Zn oxide, it is preferable to use an In—Ga—Zn oxide, a Ga—Zn oxide, gallium oxide, or the like as each of the metal oxides S1 and S3.

At this time, the metal oxide S2 serves as a main carrier path. Since the density of defect states at the interface between the metal oxides S1 and S2 and the interface between the metal oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The metal oxides S1 and S3 can make the trap state apart from the metal oxide S2. This structure can prevent the positive shift of the threshold voltage of the transistor.

A material whose conductivity is sufficiently lower than that of the metal oxide S2 is used for the metal oxides S1 and S3. In that case, the metal oxide S2, the interface between the metal oxides S1 and S2, and the interface between the metal oxides S2 and S3 mainly function as a channel region. For example, a metal oxide with high insulation performance and the atomic ratio represented by the region C in FIG. 18C can be used as the metal oxides S1 and S3. Note that the region C in FIG. 18C represents the atomic ratio of [In]:[M]: [Zn]=0:1:0 or the neighborhood thereof.

In the case where a metal oxide with the atomic ratio represented by the region A is used as the metal oxide S2, it is particularly preferable to use a metal oxide with an atomic ratio where [M]/[In] is greater than or equal to 1, preferably greater than or equal to 2 as each of the metal oxides S1 and S3. In addition, it is suitable to use a metal oxide with sufficiently high insulation performance and an atomic ratio where [M]/([Zn]+[In]) is greater than or equal to 1 as the metal oxide S3.

«Source Electrode and Drain Electrode»

One of a pair of the conductor 1240$a$ and the conductor 1241$a$ and a pair of the conductor 1240$b$ and the conductor 1241$b$ functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240$a$, 1241$a$, 1240$b$, and 1241$b$. Although a two-layer structure is shown in the drawings, a single-layer structure or a layered structure of three or more layers may be used.

For example, a titanium film may be used as the conductors 1240$a$ and 1240$b$, and an aluminum film may be used as the conductors 1241$a$ and 1241$b$. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

«Gate Electrode»

Conductors 1205$a$ and 1205$b$ functioning as a gate electrode are described. A two-layer structure of the conductor 1205$a$ and the conductor 1205$b$ is shown in FIGS. 15A to 15C, but the structure of the conductor 1205 is not limited thereto, and a single-layer structure or a layered structure of three or more layers may be used. For example, a conductor having a barrier property with respect to hydrogen, e.g., tantalum nitride, may be used as the conductor 1205$a$, and tungsten, which has high conductivity, may be stacked thereover as the conductor 1205$b$. The use of the combination of the materials can prevent diffusion of hydrogen into the metal oxide 1230 while conductivity of a wiring is ensured.

Conductors 1260*a* and 1260*b* functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or more metal elements selected from manganese or zirconium may be used. Alternatively, a semiconductor typified by polycrystalline silicon doped with an impurity element such as phosphorus, or a silicide such as nickel silicide may be used.

For example, a two-layer structure where an aluminum film is used as the conductor 1260*a* and a titanium film is used as the conductor 1260*b* is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 1260 can also be formed using a light-transmitting conductive material such as indium tin oxide, indium metal oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked structure using the above light-transmitting conductive material and the above metal.

«S-Channel Structure»

As illustrated in FIG. 15C, the transistor 1200*a* has a structure in which a side surface of the metal oxide 1230*b* is surrounded by the conductor 1260. In this specification, a structure in which a region where a channel is formed is electrically surrounded by an electric field of a gate electrode is referred to as a surrounded channel (s-channel) structure. With such a structure, the metal oxide 1230 can be electrically surrounded by the electric field of the conductor 1260, so that a channel is formed in the entire metal oxide 1230*b* (bulk). Thus, a large amount of current can flow between the source and the drain of the transistor, so that a high on-state current can be achieved. Furthermore, a voltage is applied from all directions to a region where a channel is formed, and thus, a transistor in which leakage current is suppressed can be provided.

The s-channel structure, because of its high on-state current, is suitable for a semiconductor device such as large-scale integration (LSI) that requires a miniaturized transistor. A semiconductor device including the miniaturized transistor can have a high integration degree and high density.

<Structure Example 2 of Transistor>

Figure 16A:
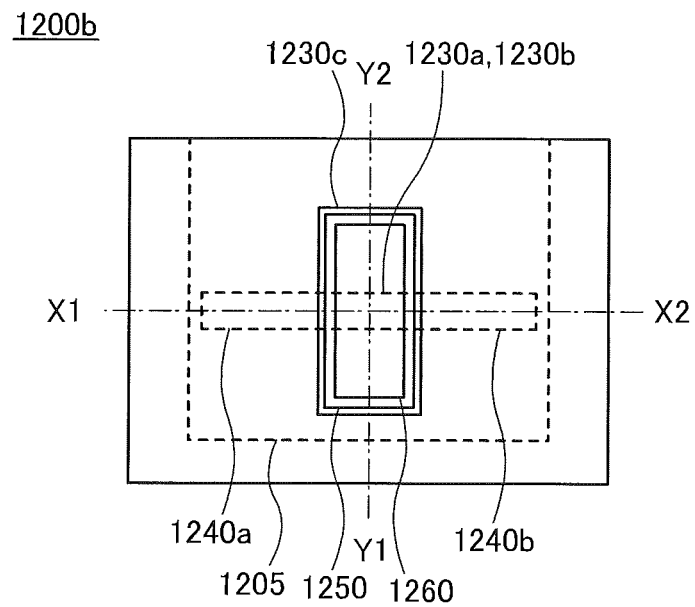
FIGS. 16A to 16C are a top view and cross-sectional views illustrating a structural example of a transistor.
Figure 16B:
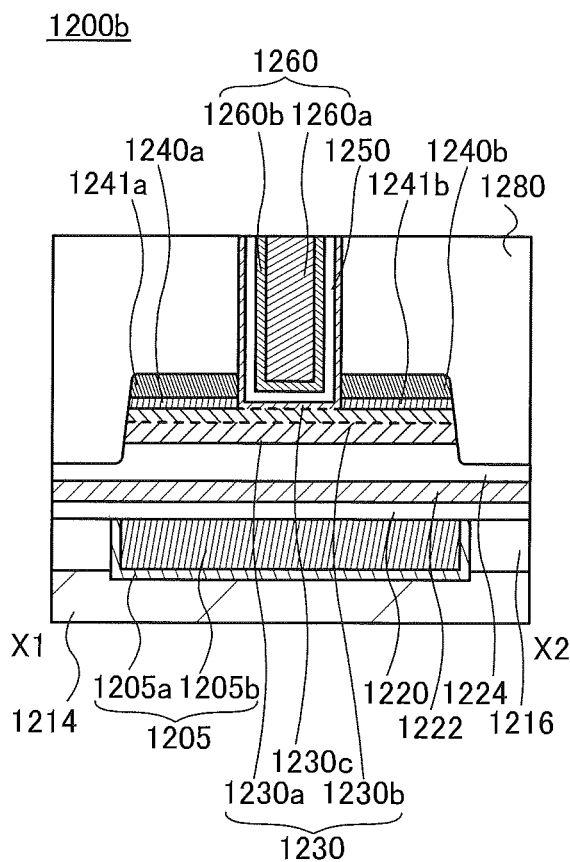
Figure 16C:
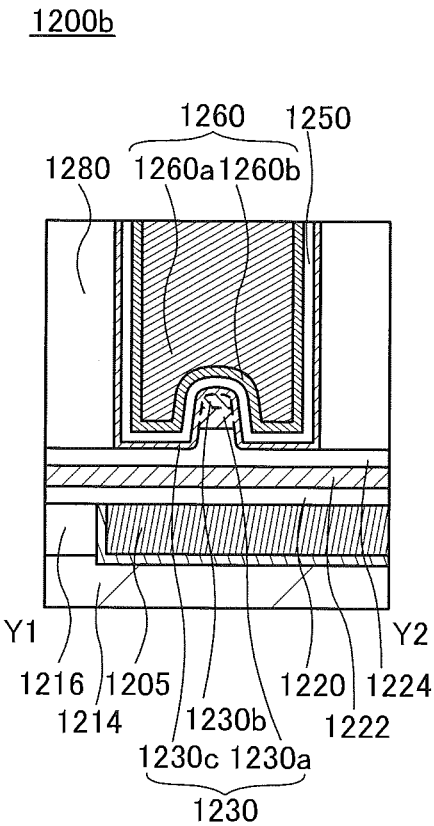

FIGS. 16A to 16C illustrates an example of a structure of a transistor different from the transistor 1200*a*. FIG. 16A illustrates a top surface of a transistor 1200*b*. FIG. 16B is a cross-sectional view taken along the dashed-dotted line X1-X2 in FIG. 16A, and FIG. 16C is a cross-sectional view taken along the dashed-dotted line Y1-Y2 in FIG. 16A.

Note that in the transistor 1200*b* in FIGS. 16A to 16C, components having the same function as the components in the transistor 1200*a* in FIGS. 15A to 15C are denoted by the same reference numerals.

In the structure illustrated in FIGS. 16A to 16C, the metal oxide 1230*c*, the insulator 1250, and the conductor 1260 are formed in an opening formed in the insulator 1280. One end portion of each of the conductors 1240*a* and 1241*a* and one end portion of each of the conductors 1240*b* and 1241*b* are aligned with an end portion of the opening formed in the insulator 1280. An end portion of each of the conductors 1240*a*, 1240*b*, 1241*a*, and 1241*b* is aligned with part of an end portion of the metal oxide 1230. Therefore, the conductors 1240*a*, 1240*b*, 1241*a*, and 1241*b* can be formed concurrently with the metal oxide 1230 or the opening in the insulator 1280. This leads to a reduction in the number of masks and steps and improvement in yield and productivity.

Since the transistor 1200*b* illustrated in FIGS. 16A to 16C has a structure in which the conductors 1240*a*, 1240*b*, 1241*a*, and 1241*b* hardly overlap with the conductor 1260, the parasitic capacitance added to the conductor 1260 can be reduced. Thus, the transistor 1200*b* with a high operation frequency can be provided.

<Structure Example 3 of Transistor>

Figure 17A:
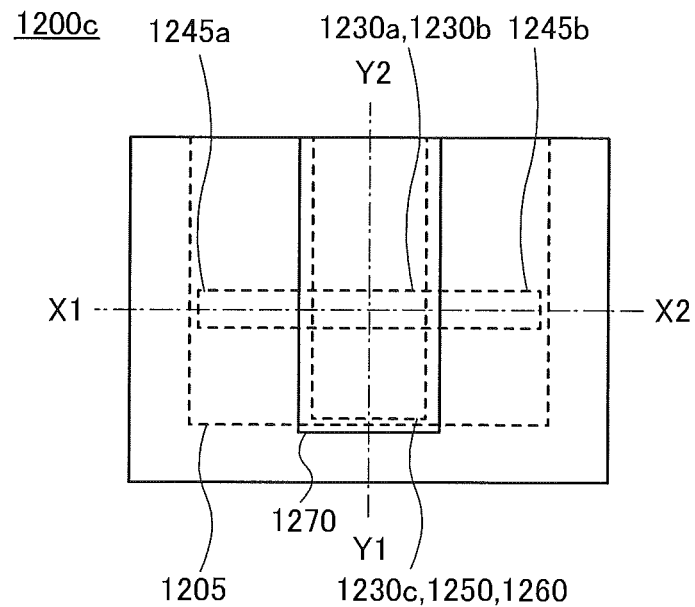
FIGS. 17A to 17C are a top view and cross-sectional views illustrating a structural example of a transistor.
Figure 17B:
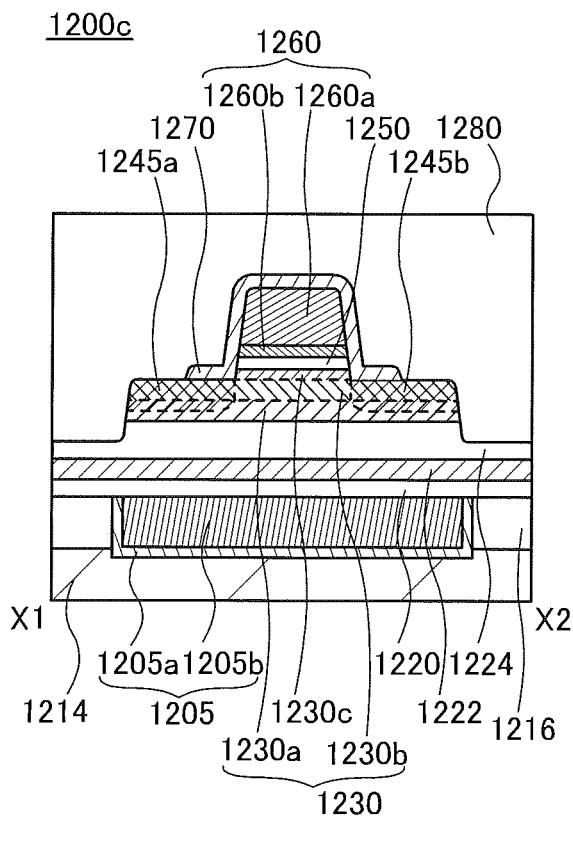
Figure 17C:
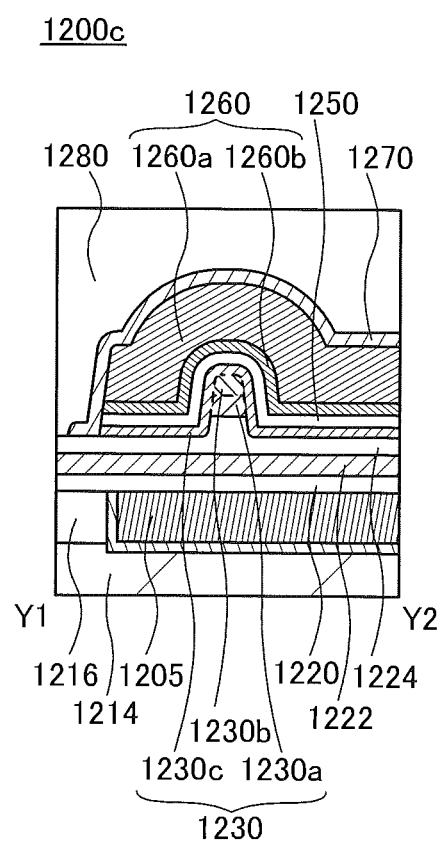

FIGS. 17A to 17C illustrate an example of a structure of a transistor different from the transistor 1200*a* and the transistor 1200*b*. FIG. 17A illustrates a top surface of a transistor 1200*c*. For simplification of the figure, some films are omitted in FIG. 17A. FIG. 17B is a cross-sectional view taken along dashed-dotted line X1-X2 in FIG. 17A, and FIG. 17C is a cross-sectional view taken along dashed-dotted line Y1-Y2 in FIG. 17A.

Note that in the transistor 1200*c* in each of FIGS. 17A to 17C, components having the same function as the components in the transistor 1200*a* in FIGS. 15A to 15C are denoted by the same reference numerals.

In the structure illustrated in FIGS. 17A to 17C, a region 1245*a* that functions as the one of the source region and the drain region and a region 1245*b* that functions as the other of the source region and the drain region are provided in the metal oxide 1230. The regions can be formed in such a manner that an impurity such as boron, phosphorus, or argon is added to the metal oxide 1230 using a conductor 1260 as a mask. Alternatively, the regions can be formed in such a manner that the insulator 1280 is formed of an insulator containing hydrogen, such as a silicon nitride film, and hydrogen is diffused to part of the metal oxide 1230. Thus, the number of masks can be reduced or the number of steps can be reduced. In addition, yield and productivity can be improved.

<Structure Example 4 of Transistor>

Figure 21A:
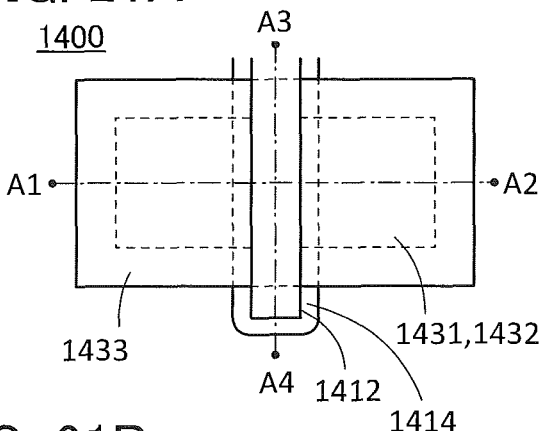
FIGS. 21A to 21D are a top view and cross-sectional views illustrating a structure example of a transistor.
Figure 21B:
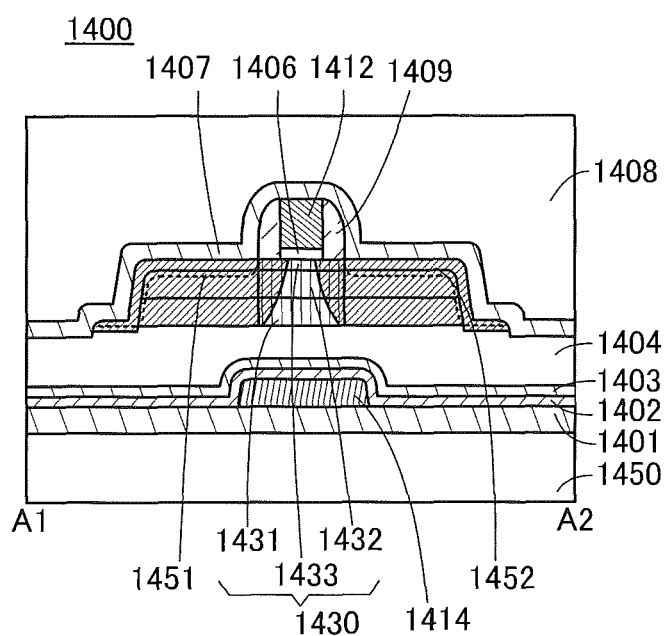
Figure 21C:
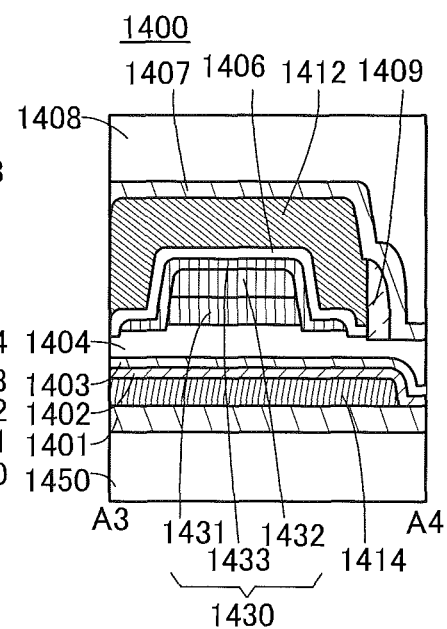

FIGS. 21A to 21D are a top view and cross-sectional views of a transistor 1400. FIG. 21A is a top view of the transistor 1400. FIG. 21B is a cross-sectional view taken along dashed-dotted line A1-A2 in FIG. 21A, and FIG. 21C is a cross-sectional view taken along dashed-dotted line A3-A4 in FIG. 21A. Note that the dashed-dotted line A1-A2 and the dashed-dotted line A3-A4 are sometimes referred to as a channel length direction and a channel width direction, respectively. The transistor 1400 has the s-channel structure like the transistor 1200*a* and the like.

The transistor 1400 includes a substrate 1450, an insulator 1401 over the substrate 1450, a conductor 1414 over the insulator 1401, an insulator 1402 provided to cover the conductor 1414, an insulator 1403 over the insulator 1402, an insulator 1404 over the insulator 1403, a stacked layer in which a metal oxide 1431, a metal oxide 1432, and a metal oxide 1433 are formed in this order (the stacked layer is collectively referred to as a metal oxide 1430 in this specification) over the insulator 1404, an insulator 1406 over the metal oxide 1433, a conductor 1412 over the insulator 1406, an insulator 1409 on side surfaces of the conductor 1412, an insulator 1407 provided to cover the insulator 1404, the metal oxide 1433, the insulator 1409, and the conductor 1412, and the insulator 1408 over the insulator 1407.

The insulator 1406 and the conductor 1412 overlap with the conductor 1414 and the metal oxide 1432 at least partly. It is preferable that the side edge of the conductor 1412 in the channel length direction be approximately aligned with the side edge of the insulator 1406 in the channel length direction. Here, the insulator 1406 serves as a gate insulator of the transistor 1400, the conductor 1412 serves as a gate electrode of the transistor 1400, and the insulator 1409 serves as a sidewall insulator of the transistor 1400.

The metal oxide 1432 has a region that overlaps with the conductor 1412 with the metal oxide 1433 and the insulator 1406 positioned therebetween. Preferably, the outer edge of the metal oxide 1431 is approximately aligned with the outer edge of the metal oxide 1432, and the outer edge of the metal oxide 1433 is positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

«Substrate»

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

«Base Insulator»

The insulator 1401 has a function of electrically isolating the substrate 1450 from the conductor 1414.

The insulator 1401 or 1402 is formed using an insulator having a single-layer structure or a layered structure. Examples of materials used in the insulator includes aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 1402 may be formed using silicon oxide with high step coverage that is formed by reacting tetraethyl orthosilicate (TEOS), silane, or the like with oxygen, nitrous oxide, or the like.

After the insulator 1402 is formed, the insulator 1402 may be subjected to planarization treatment using a CMP method or the like to improve the planarity of the top surface thereof.

The insulator 1404 preferably contains an oxide. In particular, the insulator 1404 preferably contains an oxide material from which part of oxygen is released by heating. The insulator 1404 preferably contains an oxide containing oxygen more than that in the stoichiometric composition. Part of oxygen is released by heating from an oxide film containing oxygen more than that in the stoichiometric composition. Oxygen released from the insulator 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen in excess of that in the stoichiometric composition is an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the IDS analysis is preferably higher than or equal to 100° C. and lower than or equal to 700° C., or higher than or equal to 100° C. and lower than or equal to 500° C.

The insulator 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 1404.

To make the insulator 1404 contain excess oxygen, the insulator 1404 is formed in an oxygen atmosphere, for example. Alternatively, a region containing excess oxygen may be formed by introducing oxygen into the insulator 1404 that has been formed. Both the methods may be combined.

For example, oxygen (at least including any of oxygen radicals, oxygen atoms, and oxygen ions) may be introduced into the insulator 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included. For example, a mixed gas of carbon dioxide, hydrogen, and argon may be used.

After the insulator 1404 is formed, the insulator 1404 may be subjected to planarization treatment using a CMP method or the like to improve the planarity of the top surface thereof.

The insulator 1403 has a passivation function of preventing oxygen contained in the insulator 1404 from decreasing by bonding to metal contained in the conductor 1414.

The insulator 1403 has a function of blocking oxygen, hydrogen, water, alkali metal, alkaline earth metal, and the like. Providing the insulator 1403 can prevent outward diffusion of oxygen from the metal oxide 1430 and entry of hydrogen, water, or the like into the metal oxide 1430 from the outside.

The insulator 1403 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect with respect to oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor 1400 can be controlled by injecting electrons into a charge trap layer. The charge trap layer is preferably provided in the insulator 1402 or the insulator 1403. For example, when the insulator 1403 is formed using hafnium oxide, aluminum oxide, tantalum oxide, aluminum silicate, or the like, the insulator 1403 can function as a charge trap layer.

«Gate Electrode»

The conductor 1412 functions as a first gate electrode. The conductor 1412 may have a layered structure in which a plurality of conductors overlap with each other. The conductor 1414 that is a gate electrode functions as a second gate electrode.

The conductors 1412 and 1414 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductors are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

Alternatively, the conductor 1412 and/or 1414 may be formed using any one of the metal oxides 1431 to 1433. In this case, to make the metal oxides 1431 to 1433 function as a conductor, an additional step is needed. Specifically, any one of the metal oxides 1431 to 1433 is formed as the conductor 1412 and/or 1414, and a silicon nitride film is formed as the insulator 1407 by a method using plasma containing hydrogen such as a CVD method, thereby reducing the resistance of the metal oxides 1431 to 1433. As a result, the metal oxides 1431 to 1433 function as a conductor and can be used for the conductor 1412 or conductor 1414.

«Metal Oxide Layer»

For the details of the metal oxide 1431, the description of the metal oxide 1230a illustrated in FIGS. 15A to 15C may be referred to. For the details of the metal oxide 1432, the description of the metal oxide 1230b illustrated in FIGS. 15A to 15C may be referred to. For the details of the metal oxide 1433, the description of the metal oxide 1230c illustrated in FIGS. 15A to 15C may be referred to.

«Low-resistance Region»

Figure 21D:
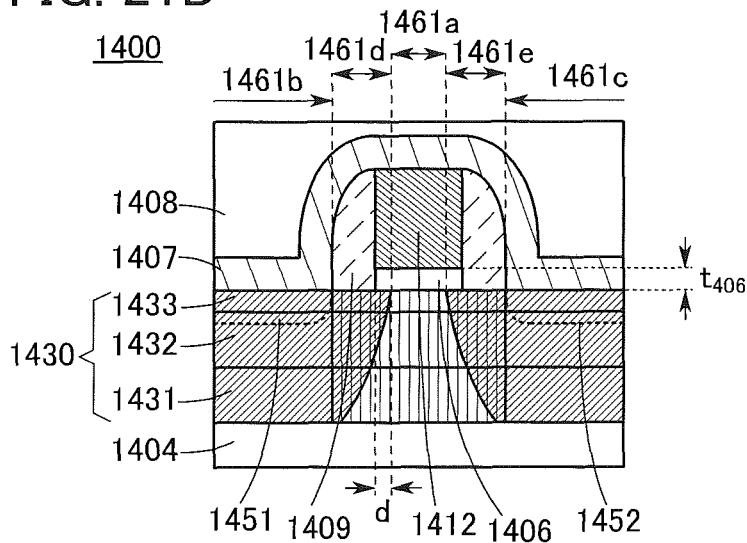

FIG. 21D is an enlarged view of part of FIG. 21B. As shown in FIG. 21D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, lower than or equal to 5%, lower than or equal to 2%, or lower than or equal to 1% of the maximum concentration of a dopant in the region 1461b or 1461c. Note that the dopant may be rephrased as a donor, an acceptor, an impurity, or an element.

As illustrated in FIG. 21D, in the metal oxide 1430, the region 1461a substantially overlaps with the conductor 1412, and the regions 1461b to 1461e are the regions other than the region 1461a. In the regions 1461b and 1461c, the top surface of the metal oxide 1433 is in contact with the insulator 1407. In the regions 1461d and 1461e, the top surface of the metal oxide 1433 is in contact with the insulator 1409 or 1406. That is, as illustrated in FIG. 21D, the border between the regions 1461b and 1461d overlaps with the border between the side edges of the insulators 1407 and 1409. The same applies to the border between the regions 1461c and 1461e. Here, part of the regions 1461d and 1461e preferably overlaps with part of a region (a channel formation region) where the metal oxide 1432 and the conductor 1412 overlap with each other. For example, preferably, the side edges of the regions 1461d and 1461e in the channel length direction are inside of the conductor 1412 and the distance between the side edge of the conductor 1412 and each of the side edges of the regions 1461d and 1461e is d. In that case, the thickness$_{t406}$ of the insulator 1406 and the distance d preferably satisfy $0.25t_{406}<d<t_{406}$.

In the above manner, the regions 1461d and 1461e are formed in part of the region where the metal oxide 1430 and the conductor 1412 overlap with each other. Accordingly, the channel formation region of the transistor 1400 is in contact with the low-resistance regions 1461d and 1461e and a high-resistance offset region is not formed between the region 1461a and each of the regions 1461d and 1461e, so that the on-state current of the transistor 1400 can be increased. Furthermore, since the side edges of the regions 1461d and 1461e in the channel length direction are formed so as to satisfy the above range, the regions 1461d and 1461e can be prevented from spreading inward too much in the channel formation region and thus the transistor 1400 can be prevented from being constantly in an on state.

The regions 1461b to 1461e are formed by ion doping treatment such as an ion implantation method. Therefore, as illustrated in FIG. 21D, the positions of the side edges of the regions 1461d and 1461e in the channel length direction are sometimes shifted to the side edge of the metal oxide 1430 in the channel length direction in a deeper area from the top surface of the metal oxide 1433. The distance d in that case is the distance between the side edge of the conductor 1412 in the channel length direction and each of the side edges of the regions 1461d and 1461e that are closest to the inner part of the conductor 1412.

In some cases, for example, the regions 1461d and 1461e in the metal oxide 1431 do not overlap with the conductor 1412. In that case, at least part of the regions 1461d and 1461e in the metal oxide 1431 or 1432 is preferably formed in a region overlapping with the conductor 1412.

In addition, low-resistance regions 1451 and 1452 are preferably formed in the metal oxide 1431, the metal oxide 1432, and the metal oxide 1433 in the vicinity of the interface with the insulator 1407. The low-resistance regions 1451 and 1452 contain at least one of elements included in the insulator 1407. Preferably, part of the low-resistance regions 1451 and 1452 is substantially in contact with or overlaps partly with the region (the channel formation region) where the metal oxide 1432 and the conductor 1412 overlap with each other.

Since a large part of the metal oxide 1433 is in contact with the insulator 1407, the low-resistance regions 1451 and 1452 are likely to be formed in the metal oxide 1433. The low-resistance regions 1451 and 1452 in the metal oxide 1433 contain a higher concentration of elements included in the insulator 1407 than the region other than the low-resistance regions 1451 and 1452 of the metal oxide 1433 (e.g., the region of the metal oxide 1433 that overlaps with the conductor 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b to 1461e other than the low-resistance regions 1451 and 1452, and the lowest in the region 1461a. The added elements refer to a dopant for forming the regions 1461b and 1461c and an element added from the insulator 1407 to the low-resistance regions 1451 and 1452.

Although the low-resistance regions 1451 and 1452 are formed in the transistor 1400, the semiconductor device shown in this embodiment is not limited to this structure. For example, the low-resistance regions 1451 and 1452 need not be formed in the case where the regions 1461b and 1461c have a sufficiently low resistance.

«Gate Insulating Film»

The insulator 1406 preferably contains an insulator with a high relative dielectric constant. For example, the insulator 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulator 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

«Interlayer Insulating Film and Protective Insulating Film»

The insulator 1407 has a function of blocking oxygen, hydrogen, water, alkali metal, alkaline earth metal, and the like. Providing the insulator 1407 can prevent outward diffusion of oxygen from the metal oxide 1430 and entry of hydrogen, water, or the like into the metal oxide 1430 from the outside.

The insulator 1407 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect with respect to oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

An aluminum oxide film is preferably used as the insulator 1407 because it is highly effective in preventing transmission of both oxygen and impurities such as hydrogen and moisture.

The insulator 1408 can be formed using an insulator containing at least one materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, neodymium oxide, and tantalum oxide. Alternatively, for the insulator 1408, a resin such as a polyimide resin, a polyamide resin, an acrylic resin, a siloxane resin, an epoxy resin, or a phenol resin can be used. The insulator 1408 may be a stack including any of the above materials.

<Structure Example 5 of Transistor>

Figure 22A:
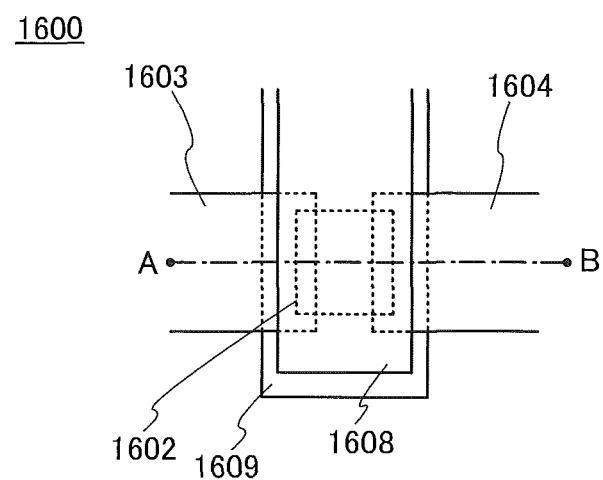
FIGS. 22A and 22B are a top view and a cross-sectional view illustrating a structure example of a transistor.
Figure 22B:
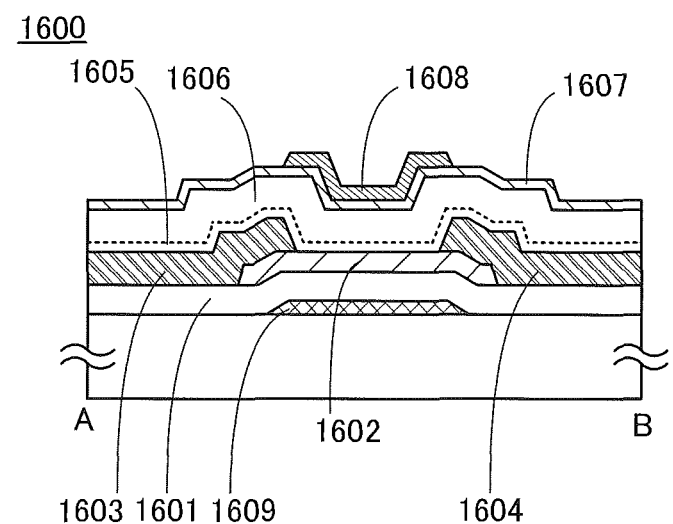

FIGS. 22A and 22B are a top view and a cross-sectional view of a transistor 1600. FIG. 22A is a top view, and FIG. 22B is a cross-sectional view taken along dashed-dotted line A-B in FIG. 22A. Note that for simplification of the drawing, some components are increased or reduced in size, or omitted in FIGS. 22A and 22B. The direction of the dashed-dotted line A-B may be referred to as a channel length direction.

The transistor 1600 illustrated in FIG. 22B includes a conductor 1609 serving as a first gate, a conductor 1608 serving as a second gate, a semiconductor 1602, a conductor 1603 and a conductor 1604 serving as a source and a drain, an insulator 1601, an insulator 1605, an insulator 1606, and an insulator 1607.

The conductor 1609 is on an insulating surface. The conductor 1609 overlaps with the semiconductor 1602 with the insulator 1601 provided therebetween. The conductor 1608 overlaps with the semiconductor 1602 with the insulators 1605, 1606, and 1607 provided therebetween. The conductors 1603 and 1604 are connected to the semiconductor 1602.

The description of the conductor 1412 or 1414 in FIGS. 21A to 21D can be referred to for the details of the conductors 1609 and 1608.

The conductors 1609 and 1608 may be supplied with different potentials, or may be supplied with the same potential at the same time. The conductor 1608 serving as a second gate electrode in the transistor 1600 leads to stabilization of threshold voltage. Note that the conductor 1608 may be omitted in some cases.

The description of the metal oxide 1230b in FIGS. 15A to 15C can be referred to for the details of the semiconductor 1602. The semiconductor 1602 may be a single layer or a stack of a plurality of semiconductor layers.

The conductors 1603 and 1604 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

The conductors 1603 and 1604 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The description of the insulator 1406 in FIGS. 21A to 21D can be referred to for the details of the insulator 1601.

The insulators 1605 to 1607 are sequentially stacked over the semiconductor 1602 and the conductors 1603 and 1604 in FIG. 22B; however, an insulator provided over the semiconductor 1602 and the conductors 1603 and 1604 may be a single layer or a stack including a plurality of insulators.

In the case of using an oxide semiconductor as the semiconductor 1602, the insulator 1606 preferably contains oxygen at a proportion higher than or equal to that in the stoichiometric composition and has a function of supplying part of oxygen to the semiconductor 1602 by heating. Note that in the case where providing the insulator 1606 directly on the semiconductor 1602 causes damage to the semiconductor 1602 at the time of formation of the insulator 1606, the insulator 1605 is preferably provided between the semiconductor 1602 and the insulator 1606, as illustrated in FIG. 22B. The insulator 1605 preferably allows oxygen to pass therethrough, and causes little damage to the semiconductor 1602 when the insulator 1605 is formed compared with the case of the insulator 1606. If damage to the semiconductor 1602 can be reduced and the insulator 1606 can be formed directly on the semiconductor 1602, the insulator 1605 is not necessarily provided.

For the insulators 1605 and 1606, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulator 1607 preferably has an effect of blocking diffusion of oxygen, hydrogen, and water. Alternatively, the insulator 1607 preferably has an effect of blocking diffusion of hydrogen and water.

As the insulator has higher density and is denser or has a fewer dangling bonds and is more chemically stable, the insulator has a higher blocking effect. An insulator that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulator that has an effect of blocking diffusion of hydrogen and water can be formed using, for example, silicon nitride or silicon nitride oxide.

In the case where the insulator 1607 has an effect of blocking diffusion of water, hydrogen, and the like, impurities such as water and hydrogen that exist in a resin in a panel or exist outside the panel can be prevented from entering the semiconductor 1602. In the case where an oxide semiconductor is used as the semiconductor 1602, part of water or hydrogen that enters the oxide semiconductor serves as an electron donor (donor). Thus, the use of the insulator 1607 having the blocking effect can prevent a shift in the threshold voltage of the transistor 1600 due to generation of donors.

In addition, since an oxide semiconductor is used for the semiconductor 1602, when the insulator 1607 has an effect of blocking diffusion of oxygen, diffusion of oxygen from the oxide semiconductor to the outside can be prevented. Accordingly, oxygen vacancies in the oxide semiconductor that serve as donors are reduced, so that a shift in the threshold voltage of the transistor 1600 due to generation of donors can be prevented.

Note that this embodiment can be combined with any of the other embodiments in this specification as appropriate.

(Embodiment 9)

Described in this embodiment are structures of an oxide semiconductor film capable of being used for the OS transistors described in the above embodiments.

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, an nc-OS, an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 23A:
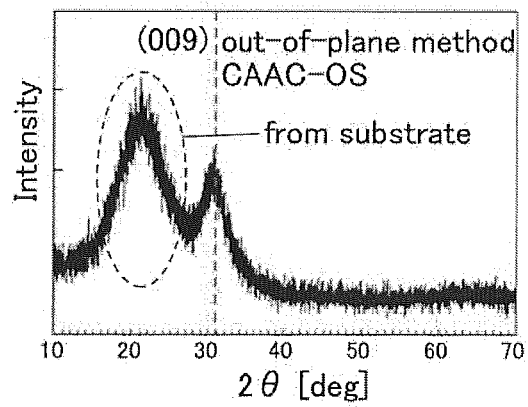
FIGS. 23A to 23E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 23A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure classified into the space group Fd-3m. Therefore, it is preferred that the CAAC-OS do not show the peak at a $2\theta$ of around 36°.

Figure 23B:
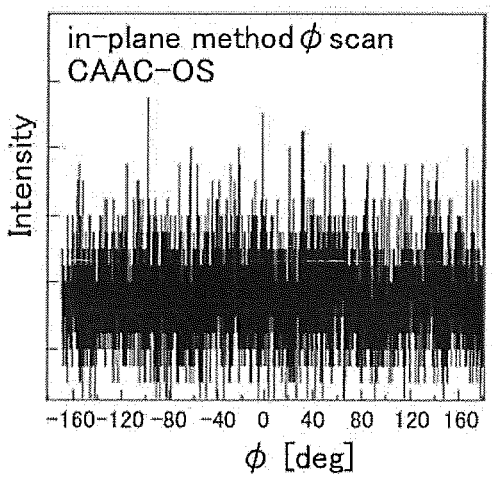
Figure 23C:
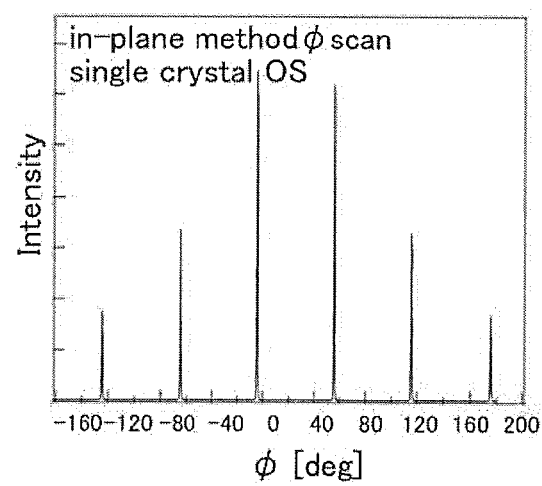

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\phi$ scan) is performed with $2\theta$ fixed at around 56° and with the sample rotated using a normal vector to the sample surface as an axis ($\phi$ axis), as shown in FIG. 23B, a peak is not clearly observed. In contrast, in the case where single crystal $InGaZnO_4$ is subjected to $\phi$ scan with $2\theta$ fixed at around 56°, as shown in FIG. 23C, six peaks that are derived from crystal planes equivalent to the (110) plane are observed. Accordingly, the structural analysis using XRD shows that the directions of a-axes and b-axes are irregularly oriented in the CAAC-OS.

Figure 23D:
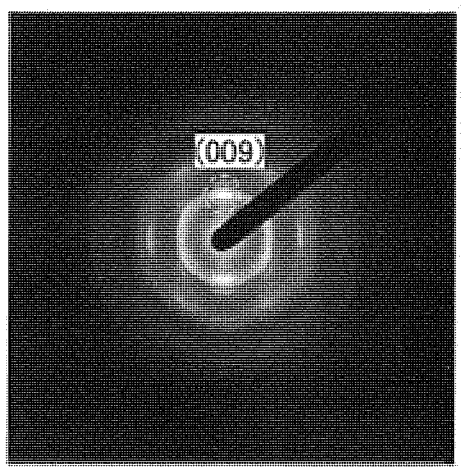
Figure 23E:
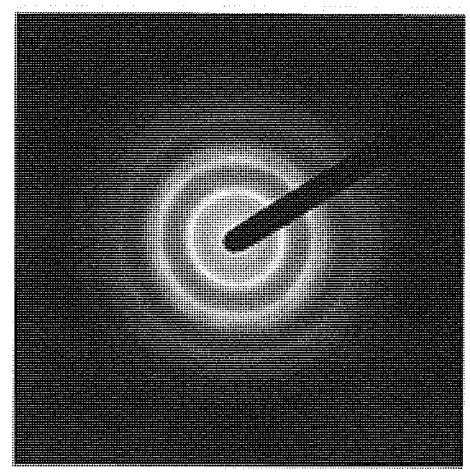

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 23D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 23E shows a diffraction pattern obtained in such a manner that an electron beam with a probe diameter of 300 nm is incident on the same sample in a direction perpendicular to the sample surface. As shown in FIG. 23E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 23E is considered to be derived from the (010) plane, the (100) plane, and the like of the $InGaZnO_4$ crystal. The second ring in FIG. 23E is considered to be derived from the (110) plane and the like.

In a combined analysis image (also referred to as a high-resolution IBM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the grain boundary is less likely to occur.

Figure 24A:
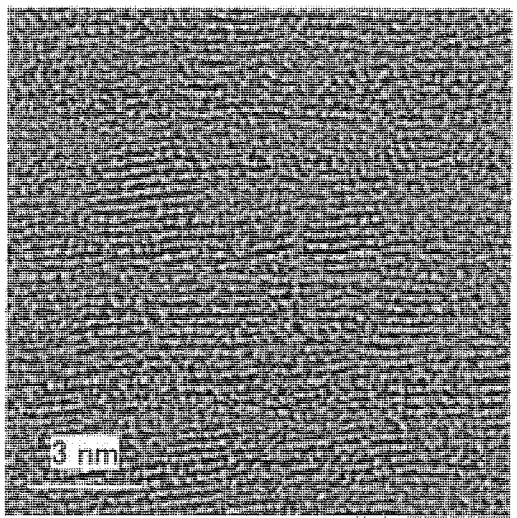
FIGS. 24A to 24E show a cross-sectional TEM image and plan-view TEM images of a CAAC-OS and images obtained through analysis thereof.

FIG. 24A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 24A shows pellets in which metal atoms are arranged in a layered manner. FIG. 24A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 24B:
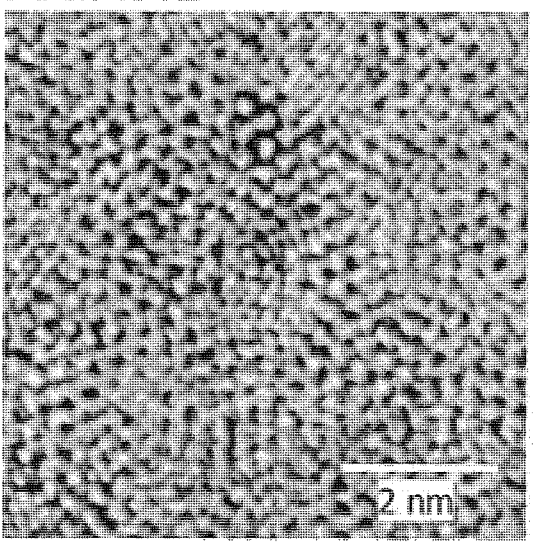
Figure 24C:
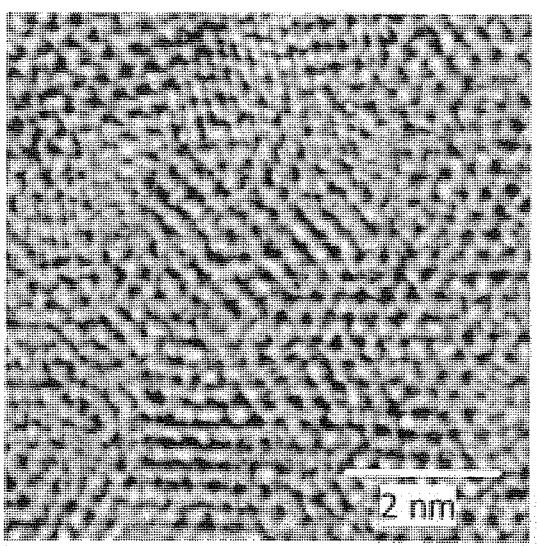
Figure 24D:
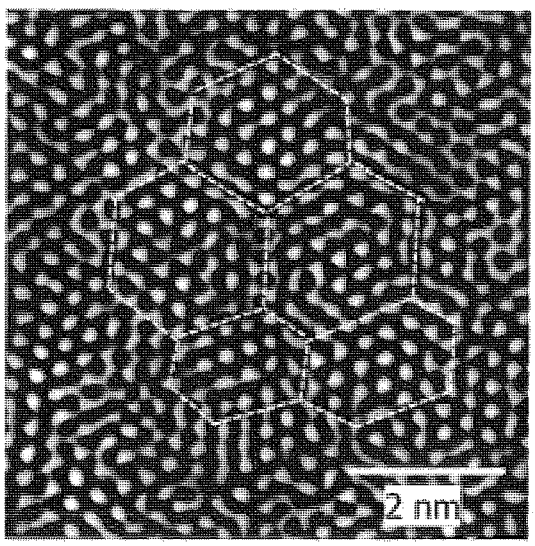
Figure 24E:
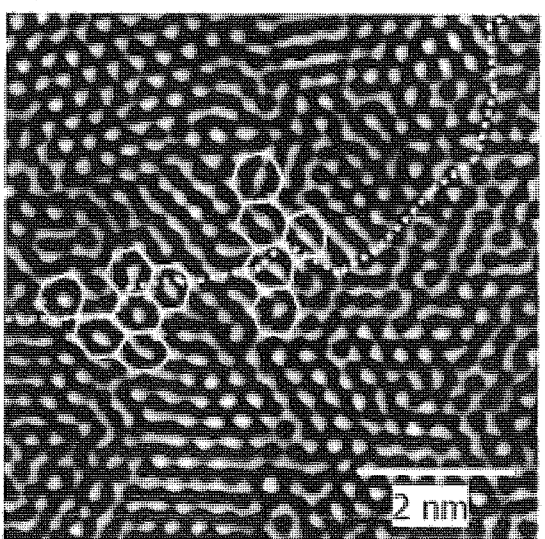

FIGS. 24B and 24C show Cs-corrected high-resolution TEM images of a plane of the CAAC-OS observed from a direction substantially perpendicular to the sample surface. FIGS. 24D and 24E are images obtained through image processing of FIGS. 24B and 24C. The method of image processing is as follows. The image in FIG. 24B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 24D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 24E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the arrangement of oxygen atoms in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 25A:
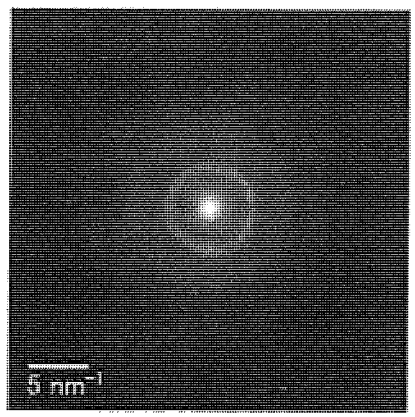
FIGS. 25A to 25D show electron diffraction patterns and a cross-sectional TEM image of an nc-OS.
Figure 25B:
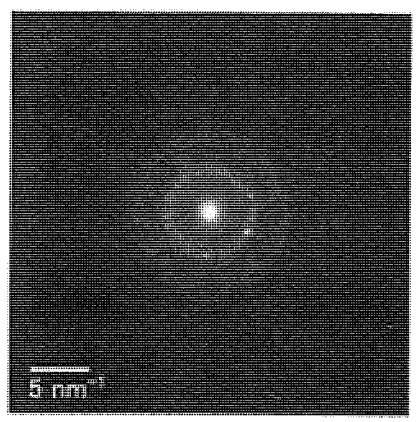

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 25A is observed. FIG. 25B shows a diffraction pattern (a nanobeam electron diffraction pattern) obtained when an electron beam with a probe diameter of 1 nm is incident on the same sample. As shown in FIG. 25B, a plurality of spots are observed in a ring-like region. In other words, ordering in an nc-OS is not observed with an electron beam with a probe diameter of 50 nm but is observed with an electron beam with a probe diameter of 1 nm.

Figure 25C:
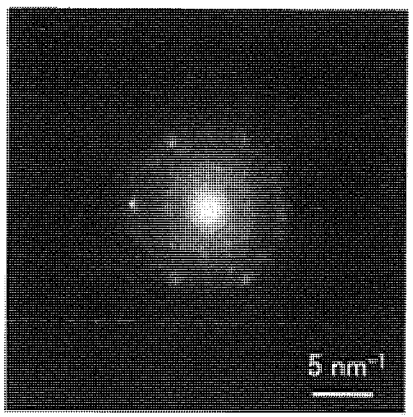

Furthermore, an electron diffraction pattern in which spots are arranged in an approximately regular hexagonal shape is observed in some cases as shown in FIG. 25C when an electron beam having a probe diameter of 1 nm is incident on a region with a thickness less than 10 nm. This means that an nc-OS has a well-ordered region, i.e., a crystal, in the range less than 10 nm in thickness. Note that an electron diffraction pattern having regularity is not observed in some regions because crystals are aligned in various directions.

Figure 25D:
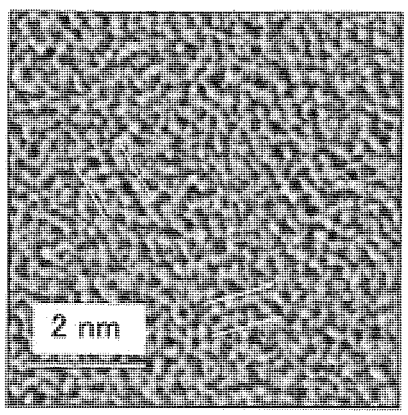

FIG. 25D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 25D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 26A:
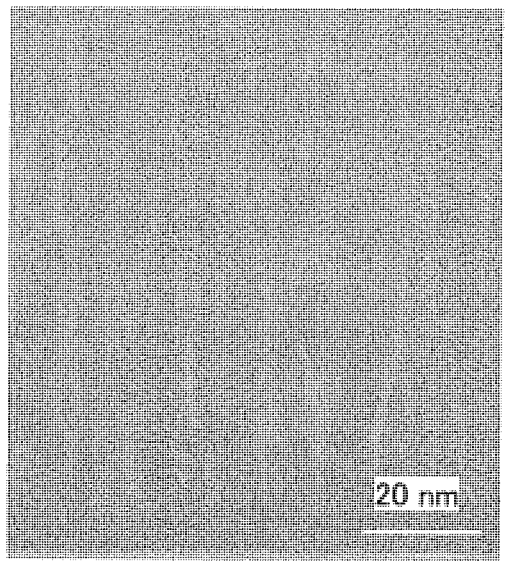
FIGS. 26A and 26B show cross-sectional TEM images of an a-like OS.
Figure 26B:
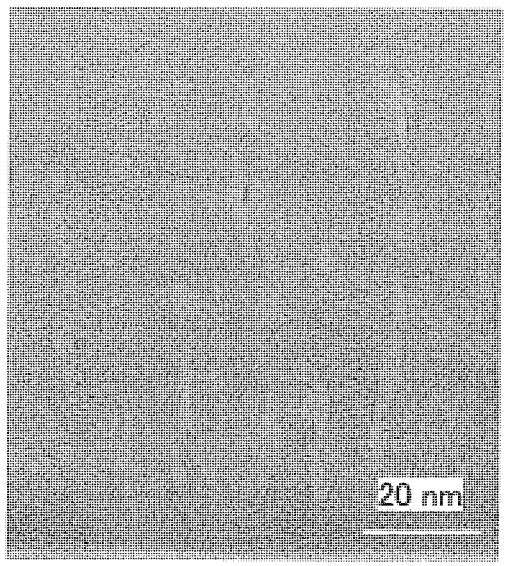

FIGS. 26A and 26B are high-resolution cross-sectional TEM images of an a-like OS. FIG. 26A is the high-resolution cross-sectional TEM image of the a-like OS at the start of the electron irradiation. FIG. 26B is the high-resolution cross-sectional TEM image of the a-like OS after the electron ($e^-$) irradiation at $4.3 \times 10^8$ $e^-/nm^2$. FIGS. 26A and 26B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the InGaZnO$_4$ crystal.

Figure 27:
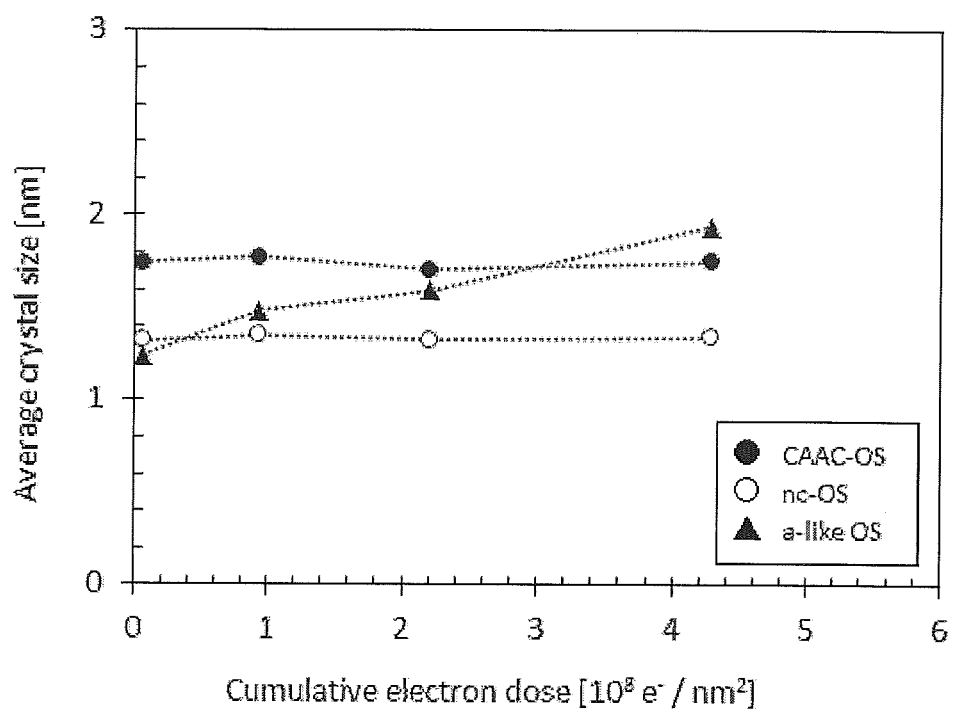
FIG. 27 shows a change in a crystal part of an In—Ga—Zn oxide induced by electron irradiation.

FIG. 27 shows change in the average size of crystal parts (at 22 points to 30 points) in each sample. Note that the crystal part size corresponds to the length of a lattice fringe. FIG. 27 indicates that the crystal part size in the a-like OS increases with an increase in the cumulative electron dose in obtaining TEM images, for example. As shown in FIG. 27, a crystal part of approximately 1.2 nm (also referred to as an initial nucleus) at the start of TEM observation grows to a size of approximately 1.9 nm at a cumulative electron (e$^-$) dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. As shown in FIG. 27, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was 6.7×10$^5$ e$^-$/(nm$^2$·s); and the diameter of the irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Thus, for example, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor is described below.

Examples of a factor affecting the carrier density of an oxide semiconductor include oxygen vacancy (V$_O$) and impurities in the oxide semiconductor.

As the amount of oxygen vacancy in the oxide semiconductor increases, the density of defect states increases when hydrogen is bonded to the oxygen vacancy (this state is also referred to as V$_O$H). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region is described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than 8×10$^{15}$ cm$^{-3}$, preferably lower than 1×10$^{11}$ cm$^3$, and further preferably lower than 1×10$^{10}$ cm$^{-3}$ and is higher than or equal to 1×10$^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the I$_d$-V$_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n type" oxide semiconductor.

The carrier density of a substantially intrinsic oxide semiconductor is preferably higher than or equal to 1×10$^5$ cm$^{-3}$ and lower than 1×10$^{18}$ cm$^{-3}$, further preferably higher than or equal to 1×10$^7$ cm$^{-3}$ and lower than or equal to 1×10$^{17}$ cm$^{-3}$, still further preferably higher than or equal to 1×10$^9$ cm$^{-3}$ and lower than or equal to 5×10$^{16}$ cm$^{-3}$, yet further preferably higher than or equal to 1×10$^{10}$ cm$^{-3}$ and lower than or equal to 1×10$^{16}$ cm$^{-3}$, and yet still preferably higher than or equal to 1×10$^{11}$ cm$^{-3}$ and lower than or equal to 1×10$^{15}$ cm$^{-3}$.

Note that this embodiment can be combined with any of the other embodiments in this specification as appropriate.

(Notes on the Description in this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

<Notes on Ordinal Numbers>

In this specification and the like, ordinal numbers such as first, second, and third are used in order to avoid confusion among components. Thus, the terms do not limit the number or order of components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It is readily appreciated by those skilled in the art that modes and details can be changed in various ways without departing from the spirit and scope of the present invention. Thus, the present invention should not be interpreted as being limited to the description of the embodiments. Note that in the structures of the invention in the embodiments, the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (this structure is referred to as a dual-gate structure in some cases), these gates are referred to as a first gate and a second gate or a front gate and a back gate in some cases. In particular, the term "front gate" can be replaced with a simple term "gate". Note that a "bottom gate" is a terminal that is formed before a channel formation region in manufacture of a transistor, and a "top gate" is a terminal that is formed after a channel formation region in manufacture of a transistor.

A transistor has three terminals: a gate, a source, and a drain. A gate is a terminal that functions as a control terminal for controlling the on/off state of a transistor. Depending on the type of the transistor or levels of potentials applied to the terminals, one of a pair of input/output terminals functions as a source and the other functions as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

140 Semiconductor»

In this specification, a "semiconductor" may have characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor layer is silicon, examples of an impurity that changes the characteristics of the semiconductor include oxygen, Group 1 elements except hydrogen, Group 2 elements, Group 13 elements, and Group 15 elements.

«Transistor»

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the drain, the channel formation region, and the source. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

«Switch»

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

«Channel Length»

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

«Channel Width»

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

«High-level Potential and Low-level Potential»

In this specification, when there is a description saying that a high-level potential is applied to a wiring, the high-level potential sometimes means at least one of the following potentials: a potential high enough to turn on an n-channel transistor with a gate connected to the wiring; and a potential high enough to turn off a p-channel transistor with a gate connected to the wiring. Thus, when high-level potentials are applied to different two or more wirings, the high-level potentials applied to the wirings may be at different levels.

In this specification, when there is a description saying that a low-level potential is applied to a wiring, the low-level potential sometimes means at least one of the following potentials: a potential low enough to turn off an n-channel transistor with a gate connected to the wiring; and a potential low enough to turn on a p-channel transistor with a gate connected to the wiring. Thus, when low-level potentials are applied to different two or more wirings, the low level potentials applied to the wirings may be at different levels.

«Connection»

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

«Parallel and Perpendicular»

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

«Trigonal and Rhombohedral»

In this specification, trigonal and rhombohedral crystal systems are included in a hexagonal crystal system.

This application is based on Japanese Patent Application serial No. 2016-014377 filed with Japan Patent Office on Jan. 28, 2016, the entire contents of which are hereby incorporated by reference.

What is claimed is:

1. A method for operating a semiconductor device comprising a CPU core, a first memory cell, and a second memory cell, the method comprising:
    a first step of writing a first data read by the CPU core from a region where the first data is held to the first memory cell;
    a second step of executing a program in the CPU core;
    a third step of interrupting the program in the CPU core;
    a fourth step of reading a second data from the first memory cell;
    a fifth step of comparing the first data read again by the CPU core from the region where the first data is held with the second data in the CPU core so as to determine whether the first data written in the first step deteriorates, and
    a sixth step of performing a refresh operation on the first memory cell and the second memory cell and performing the second step,
    wherein the second step is performed after the fifth step in the case where the first data matches the second data in the fifth step,
    wherein the sixth step is performed after the fifth step in the case where the first data does not match the second data in the fifth step,
    wherein the first memory cell comprises a first capacitor, and
    wherein the second memory cell comprises a second capacitor.

2. The method according to claim 1,
    wherein capacitance of the first capacitor is smaller than capacitance of the second capacitor.

3. The method according to claim 1,
    wherein the first memory cell comprises at least one of a first transistor and a third transistor,
    wherein the second memory cell comprises at least one of a second transistor and a fourth transistor,
    wherein a channel formation region of each of the first transistor, the second transistor, the third transistor, and the fourth transistor independently comprises an oxide semiconductor comprising at least one of indium, an element M, and zinc, and
    wherein the element M is aluminum, gallium, yttrium, or tin.

4. The method according to claim 3,
    wherein the first transistor is used as a write transistor, and
    wherein the second transistor is used as a write transistor.

5. The method according to claim 3,
    wherein the third transistor is used as a read transistor, and
    wherein the fourth transistor is used as a read transistor.

6. An electronic device comprising:
the semiconductor device that uses the method according to claim 1; and
a housing.

7. A method for operating a semiconductor device comprising a CPU core, a first memory cell, and a second memory cell, the method comprising:
writing a first data read by the CPU core from a region where the first data is held to the first memory cell;
executing a program in the CPU core;
interrupting the program in the CPU core;
reading a second data that is based on the first data from the first memory cell;
comparing the first data read again by the CPU core from the region where the first data is held with the second data in the CPU core so as to determine whether the first data written to the first memory cell deteriorates;
returning to the execution of the program again in the case where the first data matches the second data in the comparison; and
performing a refresh operation on the first memory cell and the second memory cell in the case where the first data does not match the second data in the comparison,
wherein the first memory cell comprises a first capacitor, and
wherein the second memory cell comprises a second capacitor.

8. The method according to claim 7,
wherein capacitance of the first capacitor is smaller than capacitance of the second capacitor.

9. The method according to claim 7,
wherein the first memory cell comprises at least one of a first transistor and a third transistor,
wherein the second memory cell comprises at least one of a second transistor and a fourth transistor,
wherein a channel formation region of each of the first transistor, the second transistor, the third transistor, and the fourth transistor independently comprises an oxide semiconductor comprising at least one of indium, an element M, and zinc, and
wherein the element M is aluminum, gallium, yttrium, or tin.

10. The method according to claim 9,
wherein the first transistor is used as a write transistor, and
wherein the second transistor is used as a write transistor.

11. The method according to claim 9,
wherein the third transistor is used as a read transistor, and
wherein the fourth transistor is used as a read transistor.

12. An electronic device comprising:
the semiconductor device that uses the method according to claim 7; and
a housing.

* * * * *